(12) United States Patent
Kim

(10) Patent No.: US 11,510,010 B2
(45) Date of Patent: Nov. 22, 2022

(54) DISPLAY DEVICE INCLUDING CIRCUIT BOARD HAVING SOUND GENERATOR

(71) Applicant: Samsung Display Co., LTD., Yongin-si (KR)

(72) Inventor: Jong Tae Kim, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 250 days.

(21) Appl. No.: 16/719,831

(22) Filed: Dec. 18, 2019

(65) Prior Publication Data

US 2020/0280807 A1 Sep. 3, 2020

(30) Foreign Application Priority Data

Feb. 28, 2019 (KR) .................. 10-2019-0024158
Apr. 17, 2019 (KR) .................. 10-2019-0044659

(51) Int. Cl.
| | |
|---|---|
| *H04R 1/02* | (2006.01) |
| *H04R 17/00* | (2006.01) |
| *H05K 1/02* | (2006.01) |
| *H05K 1/18* | (2006.01) |
| *H05K 5/00* | (2006.01) |

(52) U.S. Cl.
CPC ............ *H04R 17/00* (2013.01); *H04R 1/028* (2013.01); *H05K 1/0277* (2013.01); *H05K 1/181* (2013.01); *H05K 5/0017* (2013.01); *H04R 2499/15* (2013.01); *H05K 2201/056* (2013.01); *H05K 2201/10083* (2013.01)

(58) Field of Classification Search
CPC ....... H04R 17/00; H04R 1/028; H05K 5/0017
USPC ............................................ 381/87, 333–335
See application file for complete search history.

(56) References Cited

U.S. PATENT DOCUMENTS

| | | | |
|---|---|---|---|
| 8,405,921 B2 | 3/2013 | Ko et al. | |
| 9,423,044 B2 | 8/2016 | Im et al. | |
| 10,142,717 B2 | 11/2018 | Behles et al. | |
| 2005/0254674 A1* | 11/2005 | Huang | G06F 1/1626 |
| | | | 381/191 |
| 2013/0250502 A1 | 9/2013 | Tossavainen et al. | |
| 2015/0016650 A1* | 1/2015 | Kim | H04N 21/4183 |
| | | | 381/333 |
| 2016/0014525 A1* | 1/2016 | Park | H01L 41/0906 |
| | | | 381/190 |
| 2017/0005116 A1* | 1/2017 | Ambekar | G02F 1/1339 |
| 2018/0062090 A1* | 3/2018 | Kim | H01L 51/5253 |

FOREIGN PATENT DOCUMENTS

| | | |
|---|---|---|
| KR | 10-1055480 | 3/2011 |
| KR | 10-1386671 | 4/2014 |
| KR | 10-2016-0087531 | 7/2016 |

\* cited by examiner

*Primary Examiner* — George C Monikang
(74) *Attorney, Agent, or Firm* — H.C. Park & Associates, PLC

(57) ABSTRACT

A display device including a circuit board having a sound generator includes: a base layer; conductive lines disposed on the base layer; and a sound generator disposed on the conductive lines, the sound generator contracting and expanding according to the polarity of driving voltages applied thereto.

23 Claims, 21 Drawing Sheets

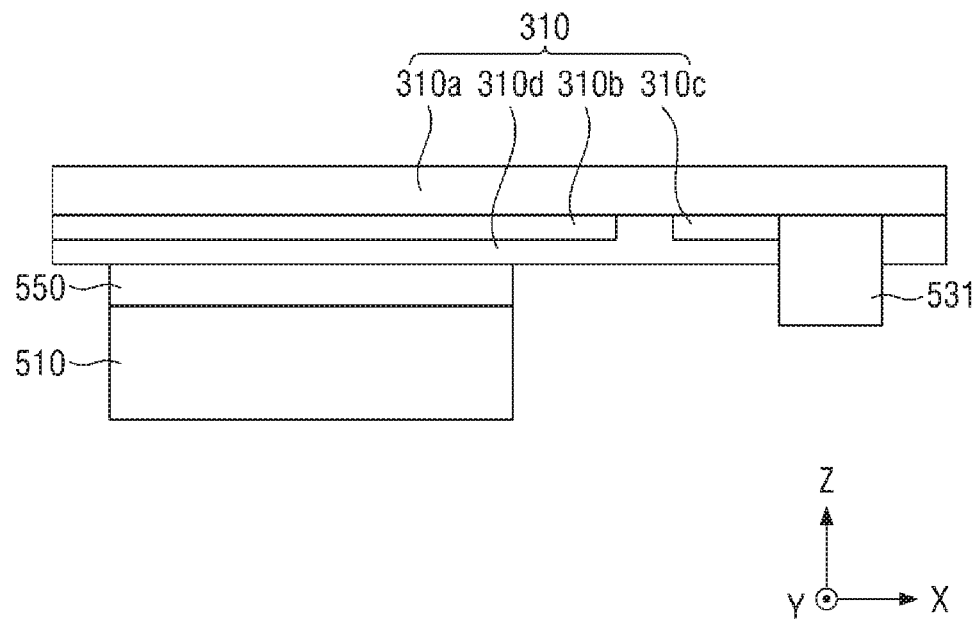
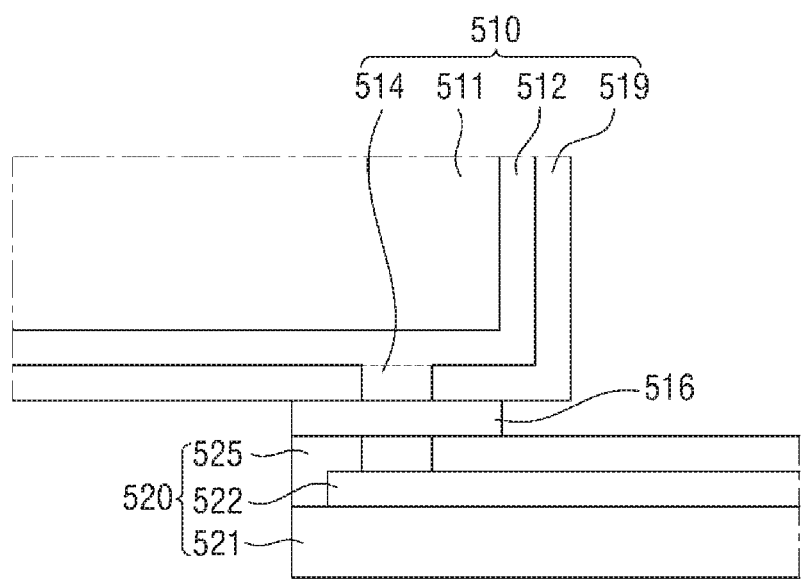

FIG. 19B
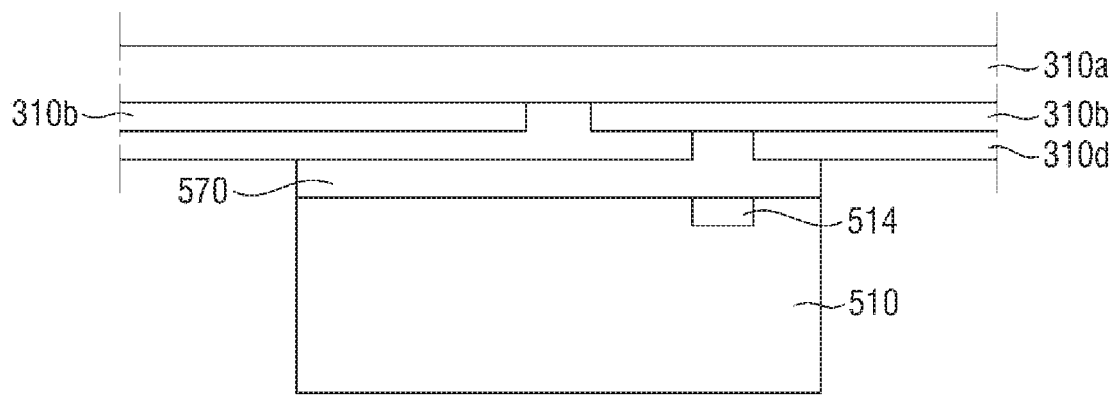
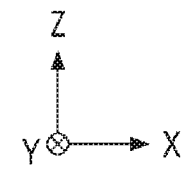
FIG. 20A
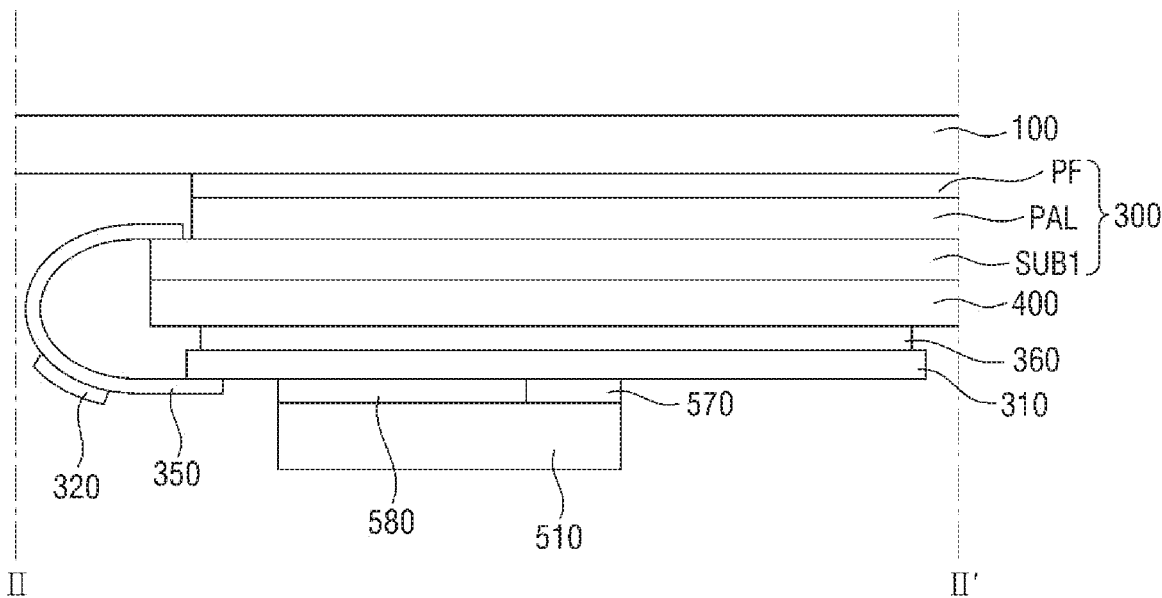

DISPLAY DEVICE INCLUDING CIRCUIT BOARD HAVING SOUND GENERATOR

CROSS REFERENCE TO RELATED APPLICATION

This application claims priority from and the benefit of Korean Patent Application No. 10-2019-0024158, filed on Feb. 28, 2019 and Korean Patent Application No. 10-2019-0044659, filed on Apr. 17, 2019, which are hereby incorporated by reference for all purposes as if fully set forth herein.

BACKGROUND

Field

Exemplary implementations of the invention relate generally to display device and, more specially, to a circuit board having a sound generator and a display device including the circuit board.

Discussion of the Background

With the development of information technologies, the demand for display devices to display images is increasing in various forms. For example, display devices are being applied to various electronic devices such as smartphones, digital cameras, notebook computers, navigation devices, and smart televisions. A display device may include a display panel for displaying an image and a sound generator for providing sound.

With the application of display devices to various electronic devices, display devices having various designs are required.

The above information disclosed in this Background section is only for understanding of the background of the inventive concepts, and, therefore, it may contain information that does not constitute prior art.

SUMMARY

Applicant discovered that display devices, such as smartphones, can have larger display areas by removing a call receiver (e.g., speaker module) for outputting the other party's voice from the front of the display devices.

Display devices having circuit boards and sound generators constructed according to the principles and exemplary implementations of the invention are capable of outputting sound using a sound generator not exposed to the outside. For example, according to some implementations of the invention, the sound generator that vibrates a display panel to output sound is disposed on a surface of the display circuit board. Therefore, it is possible to output sound using the display panel as a vibration surface by using a sound generator not exposed to the outside. Thus, a call receiver (e.g., speaker module) for outputting the other party's voice can be removed from the front of the display device, thereby enlarging the transmissive portion of a cover window. Accordingly, the display area can be enlarged.

In a display device having a circuit board and sound generator constructed according to the principles and one or more exemplary implementations of the invention, the sound generator may be attached to a surface of the display circuit board by an adhesive member and may be electrically connected to a sound connection portion disposed on the surface of the display circuit board by an FPC. Therefore, the sound generator may be integrally formed with the display circuit board in a manufacturing process of the display circuit board. Accordingly, a process or equipment for attaching the sound generator to a lower surface of an under-panel cover can be omitted, thereby reducing manufacturing costs. In addition, there is no need to provide a space to which the sound generator is to be attached in the under-panel cover.

In a display device having a circuit board and sound generator constructed according to the principles and one or more exemplary implementations of the invention, electrode pads of the sound generator and conductive lines of the display circuit board are respectively electrically connected by a soldering or an anisotropic conductive adhesive member. Therefore, the sound generator may be integrally formed with the display circuit board in a manufacturing process of the display circuit board. Accordingly, a process or equipment for attaching the sound generator to a lower surface of an under-panel cover can be omitted, thereby reducing manufacturing costs. In addition, there is no need to provide a space to which the sound generator is to be attached in the under-panel cover.

Additional features of the inventive concepts will be set forth in the description which follows, and in part will be apparent from the description, or may be learned by practice of the inventive concepts.

According to an aspect of the invention, a circuit board for a display device includes: a base layer; conductive lines disposed on the base layer; and a sound generator disposed on the conductive lines, the sound generator contracting and expanding according to the polarity of driving voltages applied thereto.

The sound generator may include a first electrode to which a first driving voltage is applied; a second electrode to which a second driving voltage is applied; a vibration layer disposed between the first electrode and the second electrode to contract or expand according to the first driving voltage and the second driving voltage; a protective layer at least partially surrounding the first electrode, the second electrode, and the vibration layer; a first electrode pad exposed by the protective layer and connected to the first electrode; and a second electrode pad exposed by the protective layer and is connected to the second electrode.

The circuit board may further include a first adhesive member disposed between the conductive lines and a surface of the sound generator.

The circuit board may further include a flexible printed circuit (FPC) having a first driving line electrically connected to the first electrode pad, a second driving line electrically connected to the second electrode pad, and a connection terminal connected to the first driving line and the second driving line; and a connector disposed on the base layer and including an insertion portion into which the connection terminal is inserted.

The circuit board may further include an FPC having a first driving line electrically connected to the first electrode pad, a second driving line electrically connected to the second electrode pad, a first circuit pad connected to the first driving line, and a second circuit pad connected to the second driving line; a circuit film disposed on the base layer and having a first film pad electrically connected to any one of the conductive lines and a second film pad electrically connected to another one of the conductive lines; and an anisotropic conductive adhesive member disposed between the first circuit pad and the first film pad and between the second circuit pad and the second film pad.

The circuit board may further include a first soldering electrically connecting any one of the conductive lines and the first electrode pad; and a second soldering electrically connecting another one of the conductive lines and the second electrode pad.

The circuit board may further include an anisotropic conductive adhesive member disposed between any one of the conductive lines and the first electrode pad and between another one of the conductive lines and the second electrode pad.

The circuit board may further include a solder-resist layer disposed on the conductive lines; and a second adhesive member disposed between the protective layer of the sound generator and the solder-resist layer.

The second adhesive member may not overlap the first electrode pad and the second electrode pad in a thickness direction of the sound generator.

According to another aspect of the invention, a display device includes: a display panel; a circuit board disposed on a first surface of the display panel; and a sound generator overlapping the circuit board in a thickness direction of the display panel and to output sound by vibrating the display panel.

The circuit board may have a first circuit board and a second circuit board, the first circuit board having a first width in a first direction, the second circuit board having a second width in the first direction, with the first width being larger than second width.

The sound generator may be disposed on a second surface opposite a first surface of the circuit board which faces the first surface of the display panel.

The display device may further include a first adhesive member disposed between the second surface of the circuit board and a first surface of the sound generator.

The display device may further include a flexible circuit board (FPC) having driving lines electrically connected to electrode pads disposed on a second surface opposite the first surface of the sound generator and a connection terminal connected to the driving lines; and a connector disposed on the second surface of the circuit board and including an insertion portion into which the connection terminal is inserted.

The display device may further include a flexible circuit board (FPC) having driving lines connected to electrode pads disposed on a second surface opposite the first surface of the sound generator and circuit pads connected to the driving lines; a circuit film disposed on the second surface of the circuit board and having film pads electrically connected to the circuit pads; and an anisotropic conductive adhesive member disposed between the circuit pads and the film pads.

The display device may further include a soldering electrically connecting electrode pads disposed on the first surface of the sound generator and conductive lines disposed on the second surface of the circuit board.

The display device may further include an anisotropic conductive adhesive member disposed between electrode pads disposed on the first surface of the sound generator and conductive lines disposed on the second surface of the circuit board.

The display device may further include a second adhesive member disposed between at least a part of the first surface of the sound generator and the second surface of the circuit board.

The second adhesive member may not overlap the electrode pads in a thickness direction of the circuit board.

The display device may further include a flexible film disposed between the display panel and the circuit board and on which an integrated driver circuit for driving the display panel is disposed.

The display device may further include a power supply circuit to supply display driving voltages to the integrated driver circuit; and a sound driver circuit to supply sound driving voltages to the sound generator.

The power supply circuit and the sound driver circuit may be disposed on the circuit board.

The sound generator may be disposed between the first surface of the display panel and the first surface of the circuit board which faces the first surface of the display panel.

The display device may further include a soldering electrically connecting electrode pads disposed on the first surface of the sound generator and conductive lines disposed on the first surface of the circuit board.

The display device may further include an anisotropic conductive adhesive member disposed between electrode pads disposed on the first surface of the sound generator and conductive lines disposed on the first surface of the circuit board.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

FIG. 7B is a detailed cross-sectional view of the display circuit board, sound generator and sound connector of FIG. 7A.

FIG. 7C is a detailed cross-sectional view the sound generator and a flexible printed circuit (FPC) of FIG. 7A.

FIG. 19B is a detailed cross-sectional view of the display circuit board and sound generator of FIG. 19A.

FIG. 20A is a cross-sectional view of still another exemplary embodiment of area A of FIG. 3 taken along lines II-II' of FIG. 17.

DETAILED DESCRIPTION

Figure 1:
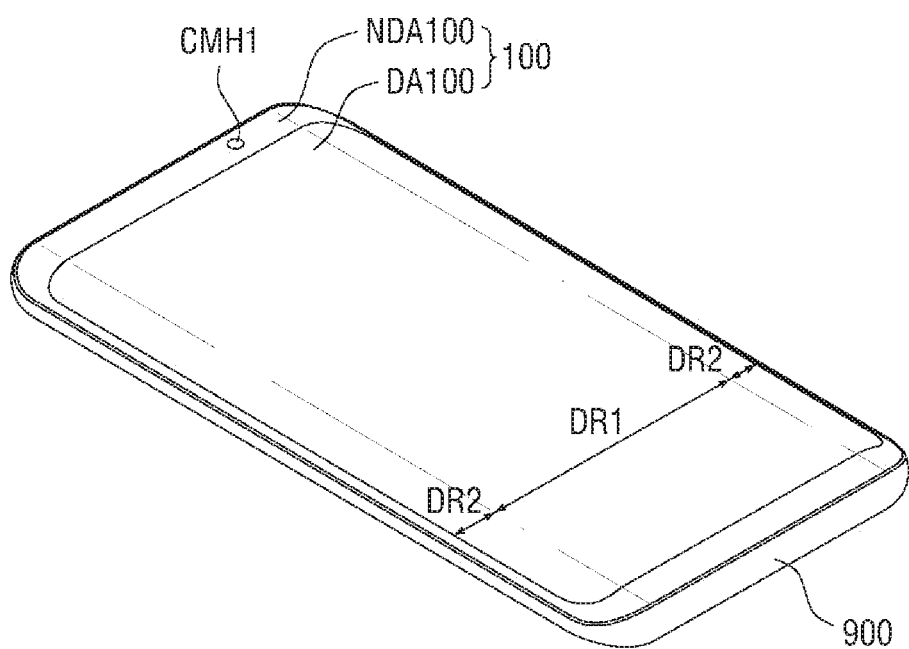
FIG. 1 is a perspective view of an exemplary embodiment of a display device constructed according to the principles of the invention.

In the following description, for the purposes of explanation, numerous specific details are set forth in order to provide a thorough understanding of various exemplary embodiments of the invention. As used herein "embodiments" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath"

other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 2:
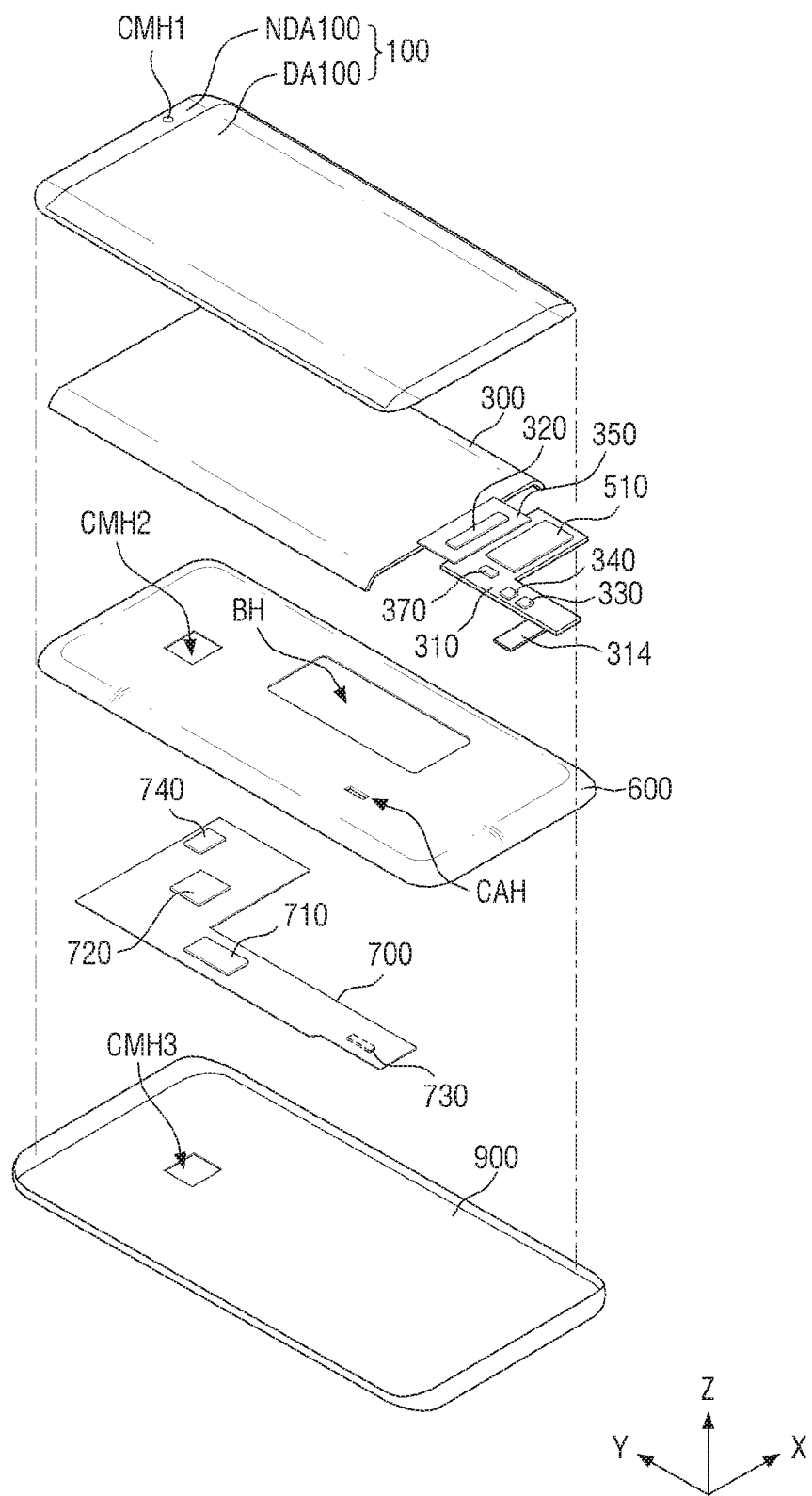
FIG. 2 is an exploded perspective view of the display device of FIG. 1.

FIG. 1 is a perspective view of an exemplary embodiment of a display device 10 constructed according to the principles of the invention. FIG. 2 is an exploded perspective view of the display device 10 of FIG. 1.

Referring to FIGS. 1 and 2, the display device 10 according to illustrated exemplary embodiment includes a cover window 100, a display panel 300, a display circuit board 310, a display driver circuit 320, a flexible film 350, a sound generator 510, a bracket 600, a main circuit board 700, and a lower cover 900.

In this specification, the terms "above", "top" and "upper surface" indicate a direction in which the cover window 100 is disposed with respect to the display panel 300, that is, a Z-axis direction, and the terms "below," "bottom" and "lower surface" indicate a direction in which the bracket 600 is disposed with respect to the display panel 300, that is, a direction opposite to the Z-axis direction. In addition, "left," "right," "upper" and "lower" indicate directions when the display panel 300 is seen in plan view. For example, "left" indicates a direction opposite to an X-axis direction, "right" indicates the X-axis direction, "upper" indicates a Y-axis direction, and "lower" indicates a direction opposite to the Y-axis direction.

The display device 10 may be generally rectangular in plan view. For example, the display device 10 may have a rectangular planar shape having short sides in a first direction (X-axis direction) and long sides in a second direction (Y-axis direction) as illustrated in FIGS. 1 and 2. Each corner where a short side extending in the first direction (X-axis direction) meets a long side extending in the second direction (Y-axis direction) may be rounded with a predetermined curvature or may be right-angled. The planar shape of the display device 10 is not limited to the rectangular shape, but may also be another shape such as polygonal, circular, or elliptical.

The display device 10 may include a first area DR1 formed substantially flat and a second area DR2 extending from right and left sides of the first area DR1. The second area DR2 may be formed flat or curved. When the second area DR2 is formed flat, an angle formed by the first area DR1 and the second area DR2 may be an obtuse angle. When the second area DR2 is formed curved, it may have a constant curvature or a varying curvature.

In FIG. 1, the second area DR2 extends from each of the right and left sides of the first area DR1. However, exemplary embodiments are not limited to this case. That is, the second area DR2 may also extend from only one of the right and left sides of the first area DR1. Alternatively, the second area DR2 may extend not only from the right and left sides of the first area DR1 but also from at least any one of upper and lower sides of the first area DR1. The case where the second area DR2 is disposed at right and left edges of the display device 10 will be mainly described below.

The cover window 100 may be disposed above the display panel 300 to cover an upper surface of the display panel 300. Thus, the cover window 100 may function to protect the upper surface of the display panel 300.

The cover window 100 may include a transmissive portion DA100 corresponding to the display panel 300 and a light shielding portion NDA100 corresponding to an area other than the display panel 300. The cover window 100 may be disposed in the first area DR1 and the second areas DR2. The transmissive portion DA100 may be disposed in a part of the first area DR1 and a part of each of the second areas DR2. The light shielding portion NDA 100 may be formed opaque. Alternatively, the light shielding portion NDA100 may be formed as a decorative layer having a pattern that can be shown to a user when an image is not displayed. For example, the light shielding portion NDA100 may be patterned with a company's logo or various characters. In addition, a first camera hole CMH1 for exposing a front camera 740 may be formed in the light shielding portion NDA100. However, exemplary embodiments are not limited to this case. For example, the first camera hole CMH1 may be formed not in the light shielding portion NDA100 but in the transmissive portion DA100. In this case, the display panel 300 may include a through hole for exposing the front camera 740.

The display panel 300 may be disposed under the cover window 100. The display panel 300 may be overlapped by the transmissive portion 100DA of the cover window 100. The display panel 300 may be disposed in the first area DR1 and the second areas DR2. Therefore, an image of the display panel 300 can be seen not only in the first area DR1 but also in the second areas DR2.

The display panel 300 may be a light emitting display panel including light emitting elements. For example, the display panel 300 may be an organic light emitting display panel using organic light emitting diodes that include organic light emitting layers, a micro light emitting diode display panel using micro light emitting diodes, a quantum dot light emitting display panel including quantum dot light emitting diodes that include quantum dot light emitting layers, or an inorganic light emitting display panel using inorganic light emitting elements that include inorganic semiconductors. The case where the display panel 300 is an organic light emitting display panel will be mainly described below.

The display circuit board 310 and the display driver circuit 320 may be attached to a side of the display panel 300. An end of the display circuit board 310 may be attached onto pads provided on the side of the display panel 300 by using an anisotropic conductive film. The display circuit board 310 may be a flexible printed circuit board that can be bent, a rigid printed circuit board that is stiff and does not bend easily, or a complex printed circuit board including both a rigid printed circuit board and a flexible printed circuit board.

The display driver circuit 320 receives control signals and power supply voltages through the display circuit board 310 and generates and outputs signals and voltages for driving the display panel 300. The display driver circuit 320 may be formed as an integrated circuit and attached onto a peripheral area of the display panel 300 using a chip-on glass (COG) method, a chip-on plastic (COP) method, or an ultrasonic method. However, exemplary embodiments are not limited to this case. For example, the display driver circuit 320 may be attached onto a flexible film 350 as shown in FIG. 2 or the display circuit board 310.

A touch driver circuit 330 may be disposed on the display circuit board 310. The touch driver circuit 330 may be formed as an integrated circuit and attached to an upper surface of the display circuit board 310. The touch driver circuit 330 may be electrically connected to sensor electrodes of a touch sensor layer of the display panel 300 through the display circuit board 310. The touch driver circuit 330 may transmit touch driving signals to driving electrodes among the sensor electrodes and output touch data including a user's touch coordinates by detecting charge change amounts of capacitances between the driving electrodes and sensing electrodes among the sensor electrodes.

A sound driver circuit 340 may be disposed on the display circuit board 310. The sound driver circuit 340 receives sound data from a main processor 710. The sound driver circuit 340 generates sound driving voltages according to the sound data and outputs the sound driving voltages to the sound generator 510. The sound driving voltages may include a first driving voltage and a second driving voltage. The sound generator 510 may contract or expand according to the first driving voltage and the second driving voltage and may vibrate the display panel 300, thereby outputting sound. The sound generator 510 may take the form of a speaker, vibrator, actuator, ultrasonic wave generator, or any other device that can generate vibration in response to an acoustic signal. Some specific examples of the type of sound generating devices that may be employed include those discussed herein.

The sound driver circuit 340 may include a digital signal processor (DSP) for processing sound data which is a digital signal, a digital-analog converter (DAC) for converting the digital data processed by the DSP into driving voltages which are analog signals, and an amplifier (AMP) for amplifying the driving voltages and outputting the amplified driving voltages.

A power supply circuit 370 for supplying display driving voltages to drive the display driver circuit 320 may be disposed on the display circuit board 310. In this case, the display driving voltages for driving the display panel 300 and the sound driving voltages for driving the sound generator 510 may be generated and supplied by different circuits, respectively. Therefore, it is possible to prevent the display driving voltages for driving the display panel 300 from being affected by the sound driving voltages for driving the sound generator 510.

A side of the flexible film 350 may be attached from under the display panel 300 onto the upper surface of the display panel 300 using an anisotropic conductive film. The other side of the flexible film 350 may be attached from above the display circuit board 310 onto the upper surface of the display circuit board 310 using an anisotropic conductive film. The flexible film 350 may be a flexible film that can be bent.

The sound generator 510 may be disposed on a surface of the display circuit board 310. The sound generator 510 may be a piezoelectric element or a piezoelectric actuator that vibrates the display panel 300 using a piezoelectric material that contracts or expands according to an applied voltage.

The bracket 600 may be disposed under the display panel 300. The bracket 600 may include plastic, metal, or both plastic and metal. The bracket 600 may include a second camera hole CMH2 into which a camera device 720 is inserted, a battery hole BH in which a battery posed, and a cable hole CAH through which a cable 314 connected to the display circuit board 310 passes.

The main circuit board 700 may be disposed under the bracket 600. The main circuit board 700 may be a printed circuit board or a flexible printed circuit board.

The main circuit board 700 may include the main processor 710, the camera device 720, a main connector 730, and the front camera 740. The camera device 720 may be disposed on both upper and lower surfaces of the main circuit board 700, the main processor 710 may be disposed on the upper surface of the main circuit board 700, and the main connector 730 may be disposed on the lower surface of the main circuit board 700.

The main processor 710 may control all the functions of the display device 10. For example, the main processor 710 may output digital video data to the display driver circuit 320 through the display circuit board 310 so that the display panel 300 displays an image. In addition, the main processor 710 may receive touch data from the touch driver circuit 330, determine a user's touch coordinates, and then execute an application indicated by an icon displayed at the user's touch coordinates. Furthermore, the main processor 710 may output sound data to the sound driver circuit 340 for driving the sound generator 510 in order to output sound by vibrating the display panel 300 using the sound generator 510. The main processor 710 may be an application processor, central processing unit, or system chip formed as an integrated circuit.

The camera device 720 processes an image frame such as a still image or a moving image obtained by an image sensor in a camera mode and outputs the processed image frame to the main processor 710.

The cable 314 passing through the cable hole CAH of the bracket 600 may be connected to the main connector 730. Therefore, the main circuit board 700 may be electrically connected to the display circuit board 310.

In addition, the main circuit board 700 may further include a mobile communication module capable of transmitting or receiving a wireless signal to or from at least one of a base station, an external terminal, and a server over a mobile communication network. The wireless signal may include a voice signal, a video call signal, or various types of data according to transmission/reception of text/multimedia messages.

The lower cover 900 may be disposed under the bracket 600 and the main circuit board 700. The lower cover 900 may be fastened and fixed to the bracket 600. The lower cover 900 may form the lower exterior of the display device 10. The lower cover 900 may include plastic, metal, or plastic and metal.

A third camera hole CMH3 exposing a lower surface of the camera device 720 may be formed in the lower cover 900. The position of the camera device 720 and the positions of the second and third camera holes CMH2 and CMH3 corresponding to the camera device 720 are not limited to the exemplary embodiment illustrated in FIG. 2.

Figure 3:
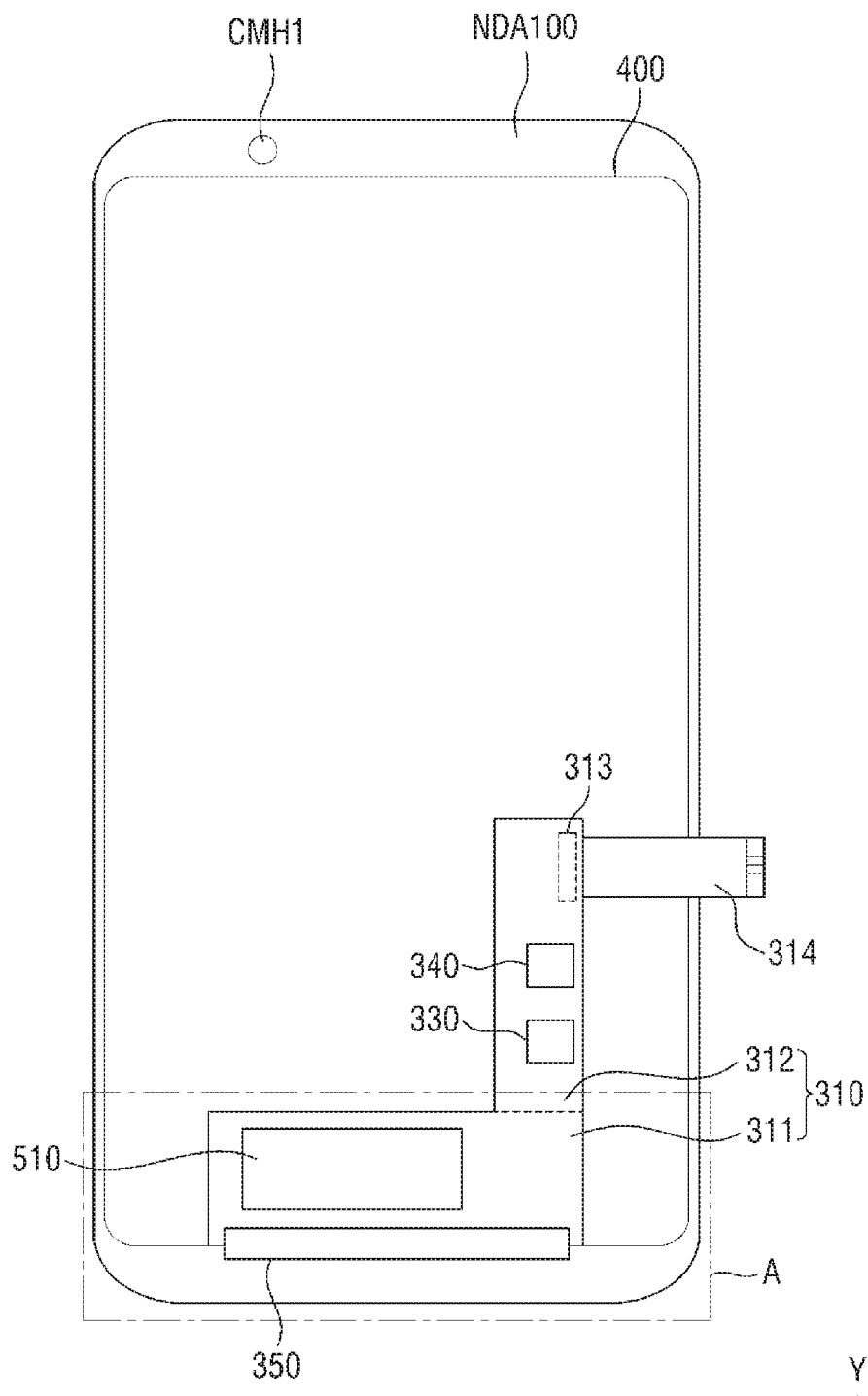
FIG. 3 is a bottom view of an exemplary embodiment of a display panel attached to a cover window of FIG. 2.
Figure 4:
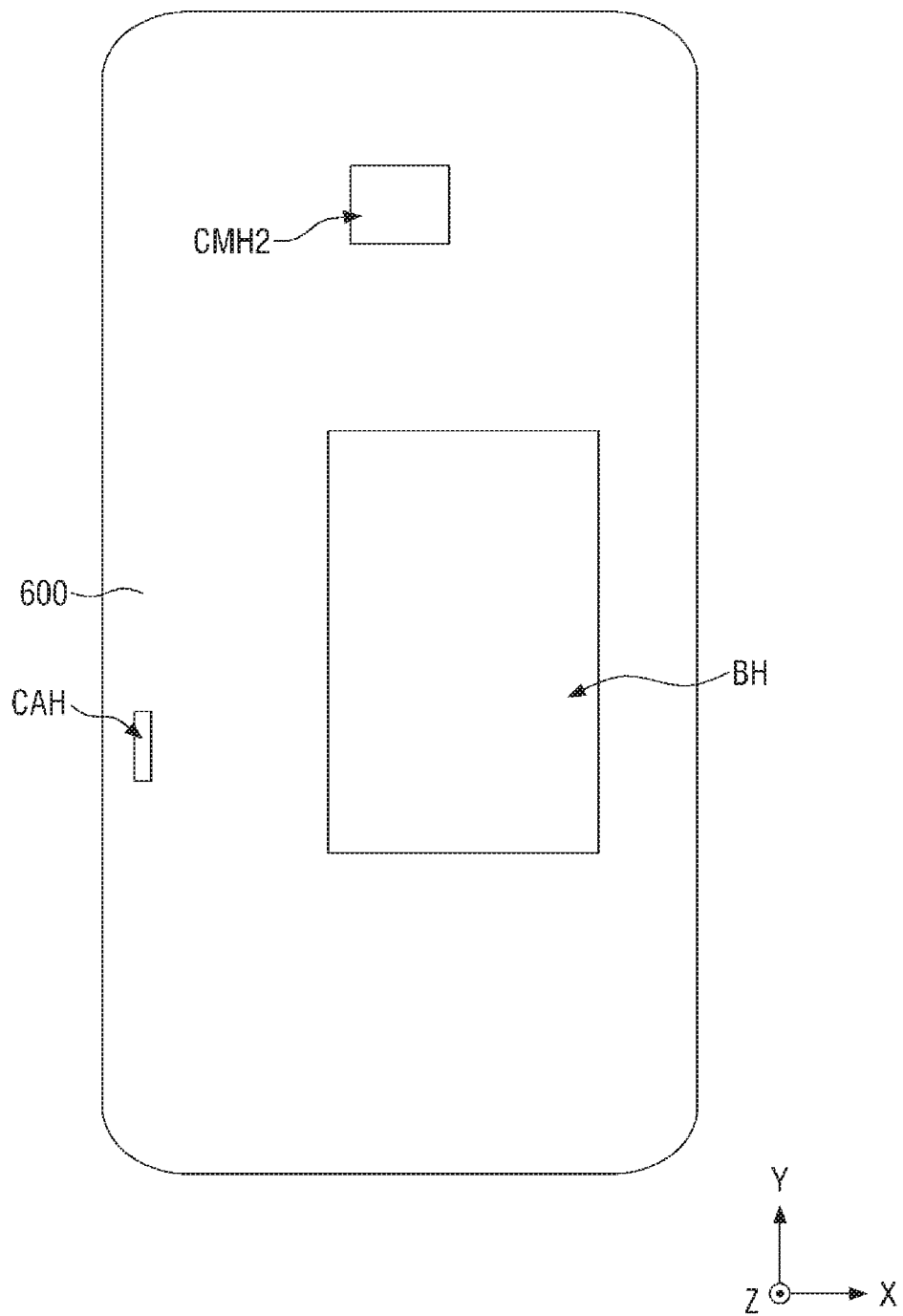
FIG. 4 is a plan view of an exemplary embodiment of a bracket of FIG. 2.
Figure 5:
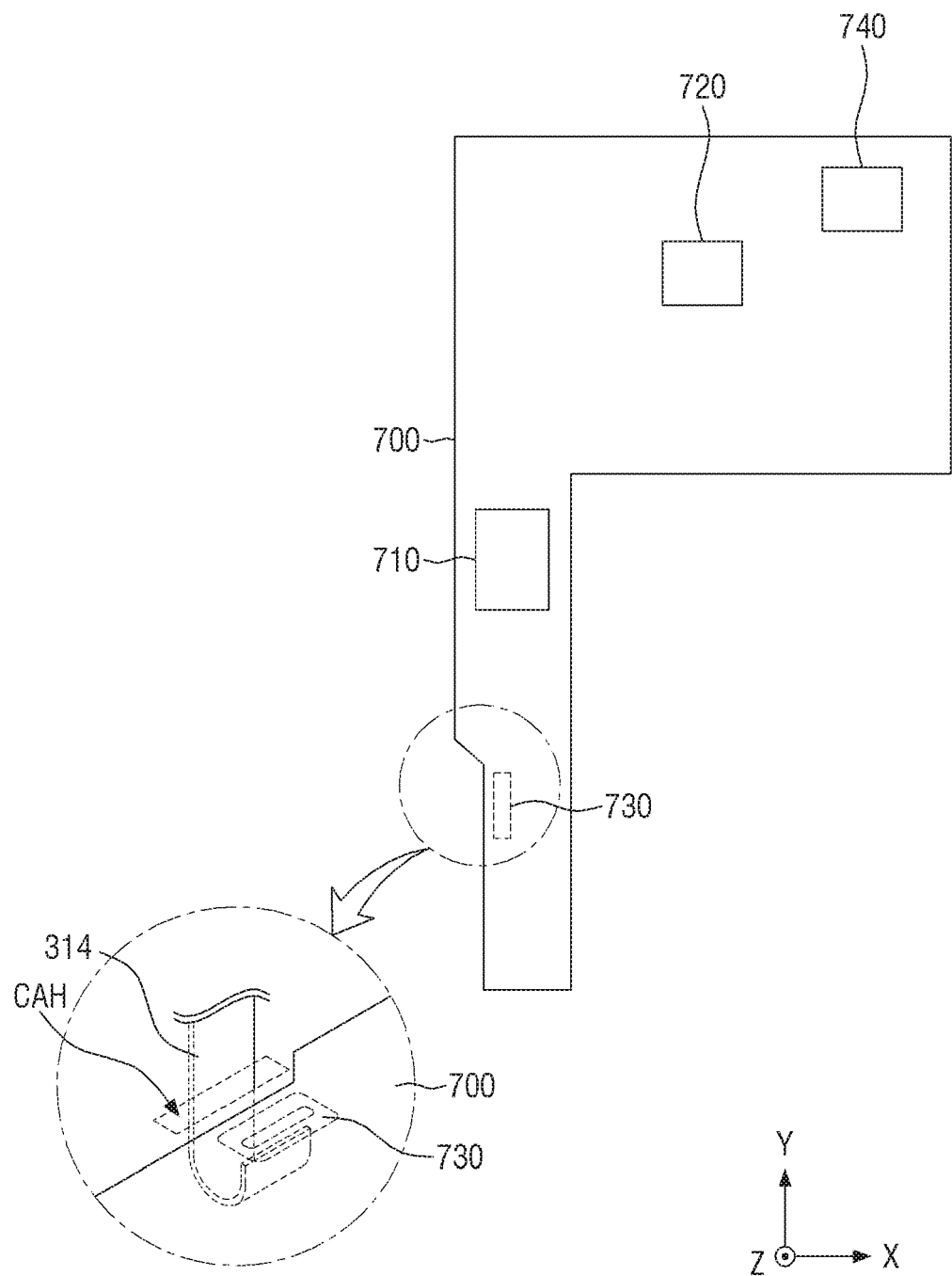
FIG. 5 is a plan view of an exemplary embodiment of a main circuit board of FIG. 2.

FIG. 3 is a bottom view of an exemplary embodiment of the display panel 300 attached to the cover window 100 of FIG. 2. FIG. 4 is a plan view of an exemplary embodiment of the bracket 600 of FIG. 2. FIG. 5 is a plan view of an exemplary embodiment of the main circuit board 700 of FIG. 2.

Referring to FIGS. 3 through 5, an under-panel cover 400 may be disposed under the display panel 300. The under-panel cover 400 may be attached to a lower surface of the display panel 300 by an adhesive member. The adhesive member may be a pressure sensitive adhesive (PSA).

The under-panel member 400 may include at least one of a light absorbing member for absorbing light incident from the outside, a buffer member for absorbing external impact, and a heat dissipating member for efficiently dissipating the heat of the display panel 300.

The light absorbing member may be disposed under the display panel 300. The light absorbing member blocks transmission of light to prevent elements disposed under the light absorbing member, for example, the display circuit board 310, the sound generator 510, etc. from being seen from above the display panel 300. The light absorbing member may include a light absorbing material such as a black pigment or dye.

The buffer member may be disposed under the light absorbing member. The buffer member absorbs external impact to prevent the display panel 300 from being damaged. The buffer member may be composed of a single layer or a plurality of layers. For example, the buffer member may be made of polymer resin such as polyurethane, polycarbonate, polypropylene or polyethylene or may be made of an elastic material such as sponge formed by foaming rubber, a urethane-based material or an acrylic-based material. The buffer member may be a cushion layer.

The heat dissipating member may be disposed under the buffer member. The heat dissipating member may include a first heat dissipating layer containing graphite or carbon nanotubes and a second heat dissipating layer formed of a metal thin film (such as copper, nickel, ferrite or silver) capable of shielding electromagnetic waves and having high thermal conductivity.

The under-panel cover 400 can be omitted, in which case elements disposed on a lower surface of the under-panel cover 400, for example, the display circuit board 310 may be disposed on the lower surface of the display panel 300 instead of the lower surface of the under-panel cover 400.

The display circuit board 310 may be bent and disposed under the under-panel cover 400 as illustrated in FIG. 3. The display circuit board 310 disposed under the under-panel cover 400 may be fixed or bonded to the lower surface of the under-panel cover 400 by a fixing member such as screws or an adhesive member such as a PSA.

The display circuit board 310 may include a first circuit board 311 and a second circuit board 312. For example, the first circuit board 311 and the second circuit board 312 may be rigid printed circuit boards or flexible printed circuit boards. If any one of the first circuit board 311 and the second circuit board 312 is a rigid printed circuit board and the other is a flexible printed circuit board, the display circuit board 310 may be a composite printed circuit board.

In FIG. 3, the second circuit board 312 extends from a side of the first circuit board 311 upwardly in the second direction (Y-axis direction). The width of the second circuit board 312 in the first direction (X-axis direction) may be smaller than the width of the first circuit board 311 in the first direction (X-axis direction).

The sound generator 510 may be disposed on a surface of the first circuit board 311. The sound generator 510 may be fixed onto the display circuit board 310 by an adhesive member such as a PSA, by an anisotropic conductive adhesive member such as anisotropic conductive paste or an anisotropic conductive film, or by a soldering. Since the display circuit board 310 is fixed to the under-panel cover 400, the display panel 300 may be vibrated by the sound generator 510 in the thickness direction (Z-axis direction).

The touch driver circuit 330 and the sound driver circuit 340 may be disposed on a surface of the second circuit board 312, and a first connector 313 may be disposed on the other surface of the second circuit board 312. The first connector 313 may include an insertion portion connected to a first connection terminal of the cable 314.

The first connection terminal disposed at an end of the cable 314 may be inserted into the insertion portion of the first connector 313. A second connection terminal disposed at the other end of the cable 314 may be bent under the main circuit board 700 through the cable hole CAH penetrating the bracket 600 and then may be inserted into an insertion portion of the main connector 730 as illustrated in FIGS. 4 and 5.

According to the exemplary embodiment illustrated in FIGS. 3 through 5, the sound generator 510 for vibrating the display panel 300 to output sound is disposed on a surface of the display circuit board 310. Therefore, it is possible to output sound using the display panel 300 as a vibration surface by using the sound generator 510 not exposed to the outside. Thus, a call receiver (e.g., speaker module) for outputting the other party's voice can be removed from the front of the display device 10, thereby enlarging the transmissive portion DA100 of the cover window 100. Accordingly, an area where an image is displayed by the display panel 300 can be enlarged.

Figure 6:
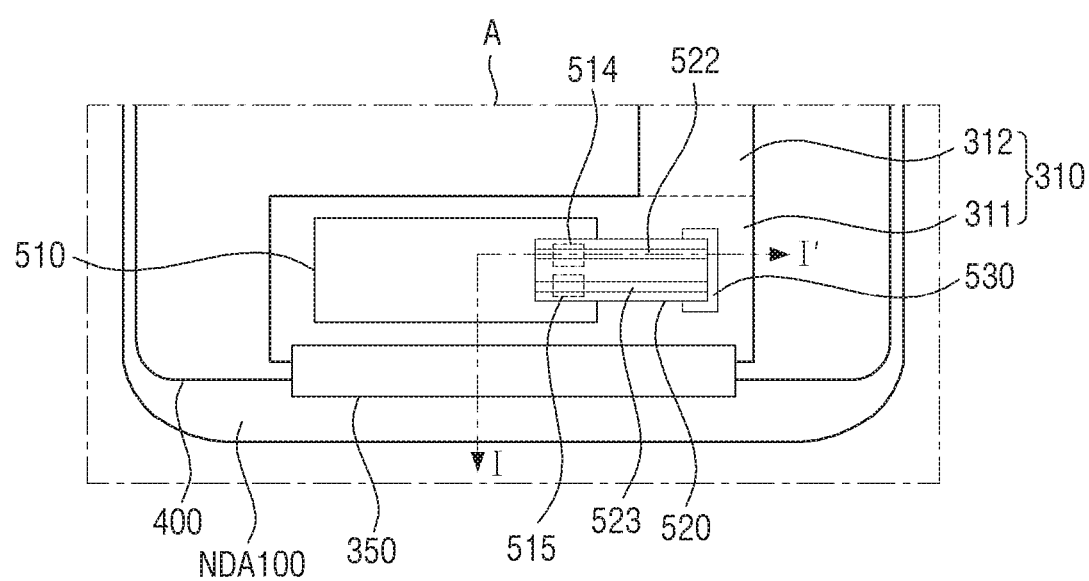
FIG. 6 is an enlarged bottom view illustrating area A of FIG. 3.

FIG. 6 is an enlarged bottom view illustrating area A of FIG. 3.

Referring to FIG. 6, the sound generator 510 and a sound connection portion 530 may be disposed on the first circuit board 311 of the display circuit board 310. The sound generator 510 and the sound connection portion 530 may be connected by a flexible printed circuit (FPC) 520.

The FPC 520 may include a first driving line 522 and a second driving line 523. The first driving line 522 and the second driving line 523 of the FPC 520 may respectively be electrically connected to a first electrode pad 514 and a second electrode pad 515 exposed on a second surface of the sound generator 510. An end of the FPC 520 may be connected to the sound connection portion 530.

Figure 16A:
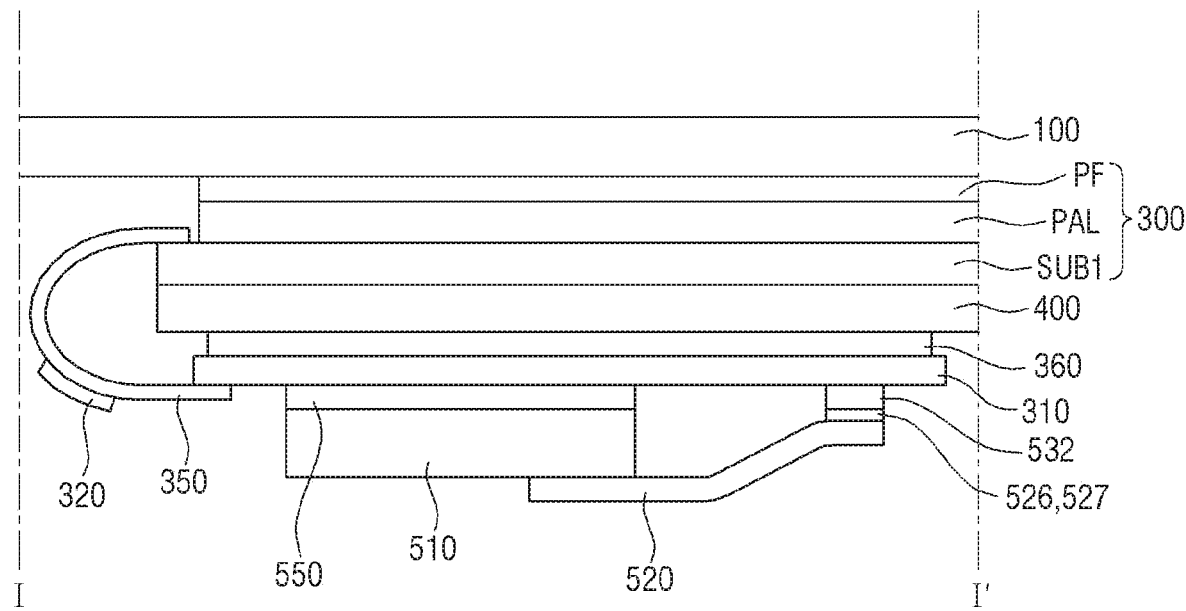
FIG. 16A is a cross-sectional view of another exemplary embodiment of area A of FIG. 3 taken along lines I-I' of FIG. 6.

The sound connection portion 530 electrically connects conductive lines (310b, 310c shown in FIG. 7B) of the first circuit board 311 and the FPC 520. The conductive lines may be called lead lines. The sound connection portion 530 may be implemented as a sound connector 531 as illustrated in FIG. 7A or a sound circuit film 532 as illustrated in FIG. 16A.

Figure 7A:
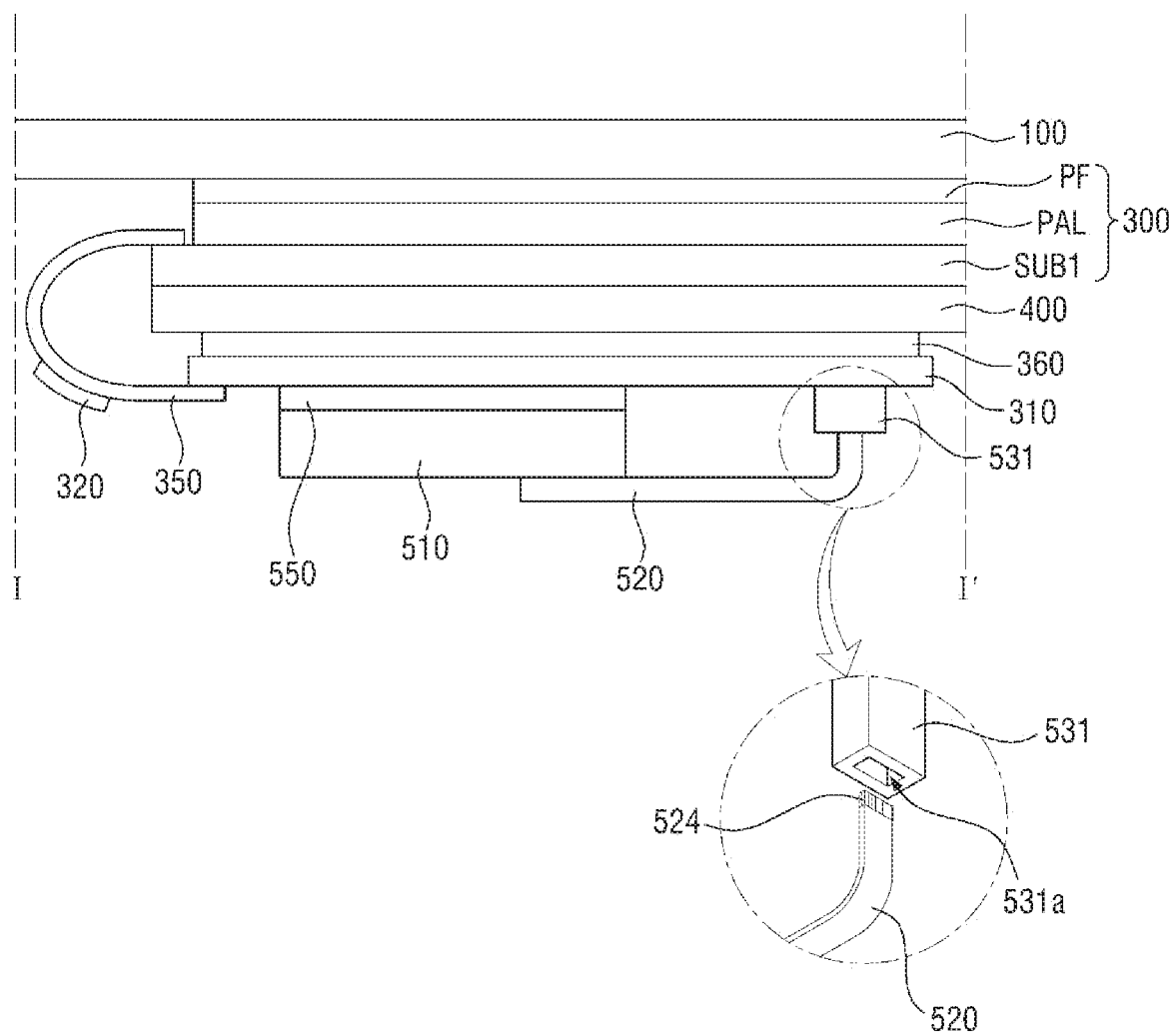
FIG. 7A is a cross-sectional view of area A of FIG. 3 taken along I-I' of FIG. 6.

FIG. 7A is a cross-sectional view of area A of FIG. 3 taken along I-I' of FIG. 6. FIG. 7B is a detailed cross-sectional view of the display circuit board 310, the sound generator 510 and the sound connector 531 of FIG. 7A. FIG. 7C is a detailed cross-sectional view of the sound generator 510 and the FPC 520 of FIG. 7A. In FIGS. 7A and 7B, the case where the sound connection portion 530 is the sound connector 531 is illustrated.

Referring to FIGS. 7A through 7C, the display panel 300 may include a substrate SUB1, a pixel array layer PAL, and a polarizing film PF.

The substrate SUB1 may be a rigid substrate or a flexible substrate that can be bent, folded, and rolled. The substrate SUB1 may be made of an insulating material such as glass, quartz, or polymer resin. The polymer material may be, for example, polyethersulphone (PES), polyacrylate (PA), polyarylate (PAR), polyetherimide (PEI), polyethylene naphthalate (PEN), polyethylene terepthalate (PET), polyphenylene sulfide (PPS), polyallylate, polyimide (PI), polycarbonate (PC), cellulose triacetate (CAT), cellulose acetate propionate (CAP), or a combination of the same. The substrate SUB1 may also include a metal material.

Figure 8:
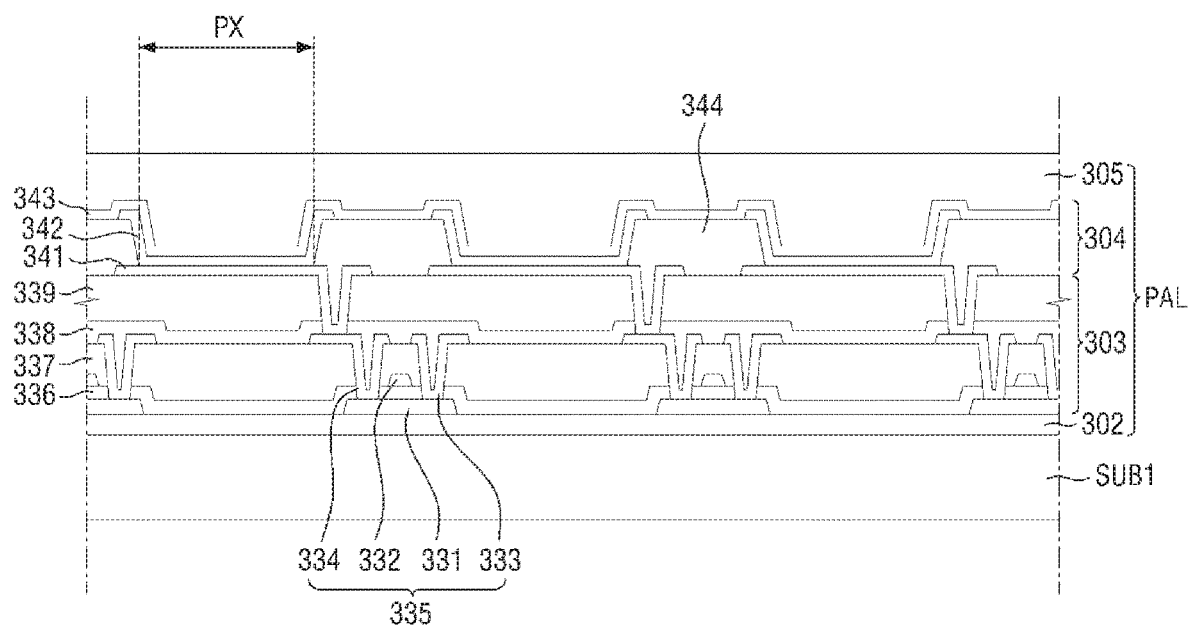
FIG. 8 is a detailed cross-sectional view of a display area of the display panel of FIG. 7A.

The pixel array layer PAL may be disposed on the substrate SUB1. The pixel array layer PAL may include pixels PX to display an image. The pixel array layer PAL may include a thin-film transistor layer 303, a light emitting element layer 304, and a thin-film encapsulation layer 305 as illustrated in FIG. 8.

The polarizing film PF may be disposed on the pixel array layer PAL in order to prevent a decrease in visibility due to reflection of external light. The polarizing film PF may include a linear polarizer and a retardation film such as a quarter-wave (λ/4) plate. In this case, the retardation film may be disposed on the pixel array layer PAL, and the linear polarizer may be disposed between the retardation film and the cover window 100.

The under-panel cover 400 may be disposed on a first surface of the display panel 300, and the cover window 100 may be disposed on a second surface of the display panel 300. That is, the under-panel cover 400 may be disposed on the substrate SUB1 of the display panel 300, and the cover window 100 may be disposed on the polarizing film PF.

The display circuit board 310 may be disposed on the under-panel cover 400. A first surface of the display circuit board 310 may be a surface facing the under-panel cover 400, and a second surface of the display circuit board 310 may be a surface opposite the first surface. As illustrated in FIG. 7A, the display circuit board 310 may be attached and fixed to the under-panel cover 400 by an adhesive member 360 such as a PSA. However, exemplary embodiments are not limited to this case. For example, the display circuit board 310 may be fixed to the under-panel cover 400 by a fixing member such as screws.

The display circuit board 310 may include a first base layer 310a, conductive lines 310b and 310c disposed on a surface of the first base layer 310a, and a first solder-resist layer 310d disposed on the conductive lines 310b and 310c as illustrated in FIG. 7B. The first base layer 310a may be made of rigid or flexible plastic. First conductive lines 310b among the conductive lines 310b and 310c refer to conductive lines not connected to the sound connector 531, and second conductive lines 310c refer to conductive lines connected to the sound connector 531. The first solder-resist layer 310d refers to an insulating layer for protecting the conductive lines 310b and 310c.

A side of the flexible film 350 may be attached onto a surface of the substrate SUB1 using an anisotropic conductive film. The other side of the flexible film 350 may be attached onto the second surface of the display circuit board 310 using an anisotropic conductive film.

The sound generator 510 may be disposed on the second surface of the display circuit board 310. A first surface of the sound generator 510 may be a surface facing the display circuit board 310, and the second surface of the sound generator 510 may be a surface opposite the first surface. The first surface of the sound generator 510 may be attached onto the second surface of the display circuit board 310 by a first adhesive member 550. The first adhesive member 550 may be a pressure sensitive adhesive (PSA). That is, the first adhesive member 550 may be disposed between the sound generator 510 and the first solder-resist layer 310d of the display circuit board 310 as illustrated in FIG. 7B. The sound generator 510 may overlap the first conductive lines 310b among the conductive lines 310b and 310c.

Referring to FIG. 7C, the sound generator 510 may include vibration layer 511, a first electrode 512, and a protection layer 519. Also, the first electrode pad 514 and the second electrode pad 515 shown in FIG. 6 may be exposed on the second surface of the sound generator 510 without being covered by the protective layer 519 disposed on the outside of the sound generator 510.

The sound generator 510 may be connected to the sound connector 531 by the FPC 520. The FPC 520 may be disposed on the second surface of the sound generator 510.

The FPC 520 may include a second base layer 521, the first driving line 522, the second driving line 523 shown in FIG. 6, a connection terminal 524, and a second solder-resist layer 525 as illustrated in FIG. 7C.

The second base layer 521 may be rigid or flexible plastic. The first driving line 522 and the second driving line 523 may be disposed on the second base layer 521, and the second solder-resist layer 525 may be disposed on the first driving line 522 and the second driving line 523. The second solder-resist layer 525 may be an insulating layer for protecting the first driving line 522 and the second driving line 523.

The first driving line 522 may be electrically connected to the first electrode pad 514, and the second driving line 523 may be electrically connected to the second electrode pad 515. An anisotropic conductive adhesive member 516 may be disposed between the first driving line 522 and the first electrode pad 514, and between the second driving line 523 and the second electrode pad 515, respectively.

Referring to FIG. 7A, the connection terminal 524 may be formed at an end of the FPC 520. The connection terminal 524 may be connected to the first driving line 522 and the second driving line 523. The connection terminal 524 may be inserted into an insertion portion 531a of the sound connector 531.

The sound connector 531 may be disposed on the second surface of the display circuit board 310 and may include the insertion portion 531a into which the connection terminal 524 of the FPC 520 is inserted. Although the insertion portion 531a is disposed in a lower surface of the sound connector 531 in FIG. 7A for easy insertion of the connection terminal 524 of the FPC 520, the position of the insertion portion 531a is not limited to this position. For example, the insertion portion 531a may be disposed in a side surface of the sound connector 531 which faces a side surface of the sound generator 510.

The sound connector 531 may be disposed on the first base layer 310a of the display circuit board 310 and connected to the second conductive lines 310c c as illustrated in FIG. 7B. The sound connector 531 may be connected to the sound driver circuit 340 shown in FIG. 3 by the second conductive lines 310c. Therefore, the first driving voltage of the sound driver circuit 340 may be applied to the first electrode pad 514 of the sound generator 510 through any one of the second conductive lines 310c, the sound connector 531, and the first driving line 522. In addition, the second driving voltage of the sound driver circuit 340 may be applied to the second electrode pad 515 of the sound generator 510 through another one of the second conductive lines 310c, the sound connector 531, and the second driving line 523.

According to the exemplary embodiment illustrated in FIGS. 7A through 7C, the sound generator 510 may be attached to a surface of the display circuit board 310 by an adhesive member and may be electrically connected to the sound connector 531 disposed on the surface of the display circuit board 310 by the FPC 520. Therefore, the sound generator 510 may be integrally formed with the display circuit board 310 in the manufacturing process of the display circuit board 310. Accordingly, a process or equipment for attaching the sound generator 510 to the lower surface of the under-panel cover 400 can be omitted, thereby reducing manufacturing costs. In addition, there is no need to provide a space to which the sound generator 510 is to be attached in the under-panel cover 400.

FIG. 8 is a detailed cross-sectional view of a display area of the display panel 300 of FIG. 7A.

Referring to FIG. 8, the display panel 300 may include the substrate SUB1 and the pixel array layer PAL. The pixel array layer PAL may include the thin-film transistor layer 303, the light emitting element layer 304, and the thin-film encapsulation layer 305 as illustrated in FIG. 8.

A buffer layer 302 may be formed on the substrate SUB1. The buffer layer may be formed on the substrate SUB1 to protect thin-film transistors 335 and light emitting elements from moisture introduced through the substrate SUB1 which is vulnerable to moisture penetration. The buffer layer 302 may be composed of a plurality of inorganic layers stacked alternately. For example, the buffer layer 302 may be a multilayer in which one or more inorganic layers selected from a silicon oxide (SiOx) layer, a silicon nitride (SiNx) layer, and SiON are alternately stacked. The buffer layer 302 can be omitted.

The thin-film transistor layer 303 is formed on the buffer layer 302. The thin-film transistor layer 303 includes the thin-film transistors 335, a gate insulating layer 336, an interlayer insulating film 337, a protective layer 338, and a planarization layer 339.

Each of the thin-film transistors 335 includes an active layer 331, a gate electrode 332, a source electrode 333, and a drain electrode 334. In FIG. 8, each of the thin-film transistors 335 is formed as a top-gate type in which the gate electrode 332 is located above the active layer 331. However, it should be noted that exemplary embodiments are not limited to this case. That is, one or more of the thin-film transistors 335 may also be formed as a bottom-gate type in which the gate electrode 332 is located under the active layer 331 or a double-gate type in which the gate electrode 332 is located both above and under the active layer 331.

The active layers 331 are formed on the buffer layer 302. The active layers 331 may be made of a silicon-based semiconductor material or an oxide-based semiconductor material. A light shielding layer may be formed between the buffer layer 302 and the active layers 331 to block external light from entering the active layers 331.

The gate insulating layer 336 may be formed on the active layers 331. The gate insulating layer 336 may be an inorganic layer, for example, a SiOx layer, a SiNx layer, or a multilayer composed of these layers.

The gate electrodes 332 and gate lines may be formed on the gate insulating layer 336. Each of the gate electrodes 332 and the gate lines may be a single layer or a multilayer made of any one or more of molybdenum (Mo), aluminum (Al), chromium (Cr), gold (Au), titanium (Ti), nickel (Ni), neodymium (Ne), copper (Cu), and alloys of the same.

The interlayer insulating film 337 may be formed on the gate electrodes 332 and the gate lines. The interlayer insulating film 337 may be an inorganic layer, for example, a SiOx layer, a SiNx layer, or a multilayer composed of these layers.

The source electrodes 333, the drain electrodes 334, and data lines may be formed on the interlayer insulating film 337. Each of the source electrodes 333 and the drain electrodes 334 may be connected to an active layer 331 through a contact hole penetrating the gate insulating layer 336 and the interlayer insulating film 337. Each of the source electrodes 333, the drain electrodes 334 and the data lines may be a single layer or a multilayer made of any one or more of molybdenum (Mo), aluminum (Al), chromium (Cr), gold (Au), titanium (Ti), nickel (Ni), neodymium (Ne), copper (Cu), and alloys of the same.

The protective layer 338 for insulating the thin-film transistors 335 may be formed on the source electrodes 333, the drain electrodes 334, and the data lines. The protective layer 338 may be an inorganic layer, for example, a SiOx layer, a SiNx layer, or a multilayer composed of these layers.

The planarization layer 339 may be formed on the protective layer 338 to planarize steps due to the thin-film transistors 335. The planarization layer 339 may be made of an organic layer such as acryl resin, epoxy resin, phenolic resin, polyamide resin, or polyimide resin.

The light emitting element layer 304 is formed on the thin-film transistor layer 303. The light emitting element layer 304 includes the light emitting elements and a pixel defining layer 344.

The light emitting elements and the pixel defining layer 344 are formed on the planarization layer 339. The light emitting elements may be organic light emitting devices, each including an anode 341, a light emitting layer 342, and a cathode 343.

The anodes 341 may be formed on the planarization layer 339. The anode 341 may be connected to the source electrode 333 or the drain electrode 334 of the thin-film transistor 335 through contact holes penetrating the protective layer 338 and the planarization layer 339.

The pixel defining layer 344 may be formed on the planarization layer 339 and may cover edges of the anodes 341 to define pixels. That is, the pixel defining layer 344 serves as a pixel defining layer for defining pixels. Each of the pixels is an area in which the anode 341, the light emitting layer 342 and the cathode 343 are sequentially stacked so that holes from the anode 341 and electrons from the cathode 343 combine together in the light emitting layer 342 to emit light.

The light emitting layers 342 are formed on the anodes 341 and the pixel defining layer 344. The light emitting layers 342 may be organic light emitting layers. Each of the light emitting layers 342 may emit one of red light, green light, and blue light. Alternatively, the light emitting layers 342 may be white light emitting layers which emit white light. In this case, the light emitting layers 342 may be a stack of a red light emitting layer, a green light emitting layer and a blue light emitting layer and may be a common layer formed commonly to the pixels. In this case, the display panel 300 may further include color filters for displaying red, green and blue.

Each of the light emitting layers 342 may include a hole transporting layer, a light emitting layer, and an electron transporting layer. In addition, each of the light emitting layers 342 may be formed in a tandem structure of two or more stacks, in which case a charge generating layer may be formed between the stacks.

The cathode 343 is formed on the light emitting layers 342. The cathode 343 may be formed to cover the light emitting layers 342. The cathode 343 may be a common layer formed commonly to the pixels.

When the light emitting element layer 304 is formed as a top emission type which emits light in an upward direction, the anodes 341 may be made of a metal material having high reflectivity, such as a stacked structure (Ti/Al/Ti) of Al and Ti, a stacked structure (ITO/Al/ITO) of Al and indium tin oxide (ITO), an APC alloy, or a stacked structure (ITO/APC/ITO) of an APC alloy and ITO. The APC alloy is an alloy of Ag, palladium (Pd), and Cu. In addition, the cathode 343 may be made of a transparent conductive material (TCO) capable of transmitting light, such as ITO or indium zinc oxide (IZO), or a semi-transmissive conductive material such as magnesium (Mg), Ag or an alloy of Mg and Ag. When the cathode 343 is made of a semi-transmissive conductive material, the light output efficiency may be increased by microcavities.

When the light emitting element layer 304 is formed as a bottom emission type which emits light in a downward direction, the anodes 341 may be made of a transparent conductive material (TCO) such as ITO or IZO or a semi-transmissive conductive material such as Mg, Ag or an alloy of Mg and Ag. The cathode 343 may be made of a metal material having high reflectivity, such as a stacked structure (Ti/Al/Ti) of Al and Ti, a stacked structure (ITO/Al/ITO) of Al and ITO, an APC alloy, or a stacked structure (ITO/APC/ITO) of an APC alloy and ITO. When the anodes 341 are made of a semi-transmissive conductive material, the light output efficiency may be increased by microcavities.

The thin-film encapsulation layer 305 is formed on the light emitting element layer 304. The thin-film encapsulation layer 305 serves to prevent oxygen or moisture from permeating the light emitting layers 342 and the cathode 343. To this end, the thin-film encapsulation layer 305 may include at least one inorganic layer. The inorganic layer may be made of silicon nitride, aluminum nitride, zirconium nitride, titanium nitride, hafnium nitride, tantalum nitride, silicon oxide, aluminum oxide, or titanium oxide. In addition, the thin-film encapsulation layer 305 may further include at least one organic layer. The organic layer may be formed to a sufficient thickness to prevent particles from penetrating the thin-film encapsulation layer 305 and entering the light emitting layers 342 and the cathode 343. The organic layer may include any one of epoxy, acrylate, and urethane acrylate.

The touch sensor layer may be formed on the thin-film encapsulation layer 305. When the touch sensor layer is disposed directly on the thin-film encapsulation layer 305, the thickness of the display device 10 can be reduced as compared with when a separate touch panel is attached to the thin-film encapsulation layer 305.

The touch sensor layer may include sensor electrodes for sensing a user's touch using a capacitance method and touch lines for connecting pads and the sensor electrodes. For example, the touch sensor layer may sense a user's touch using a self-capacitance method or a mutual capacitance method.

Figure 9:
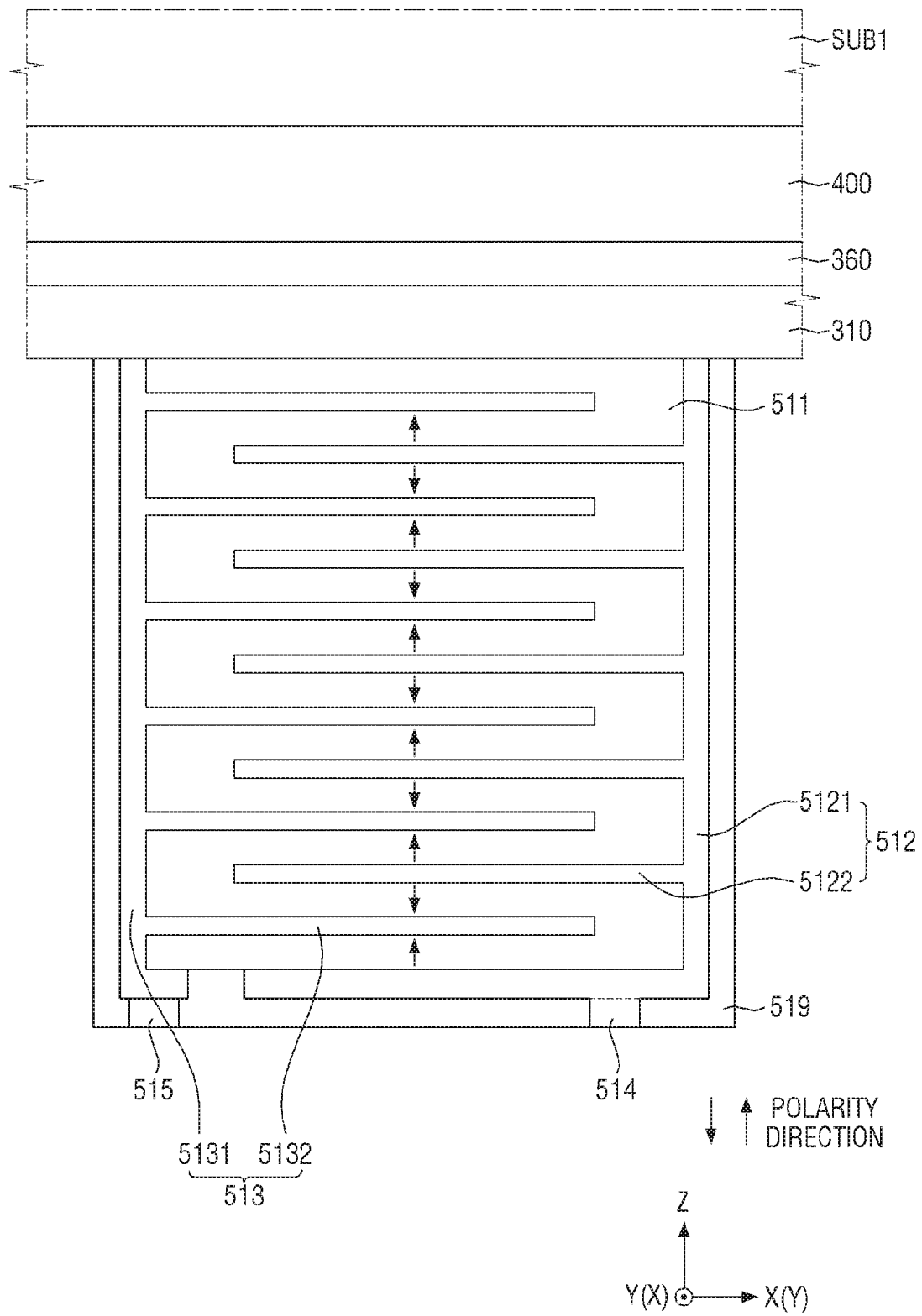
FIG. 9 is a cross-sectional view of an exemplary embodiment of the sound generator of FIG. 7A.
Figure 10:
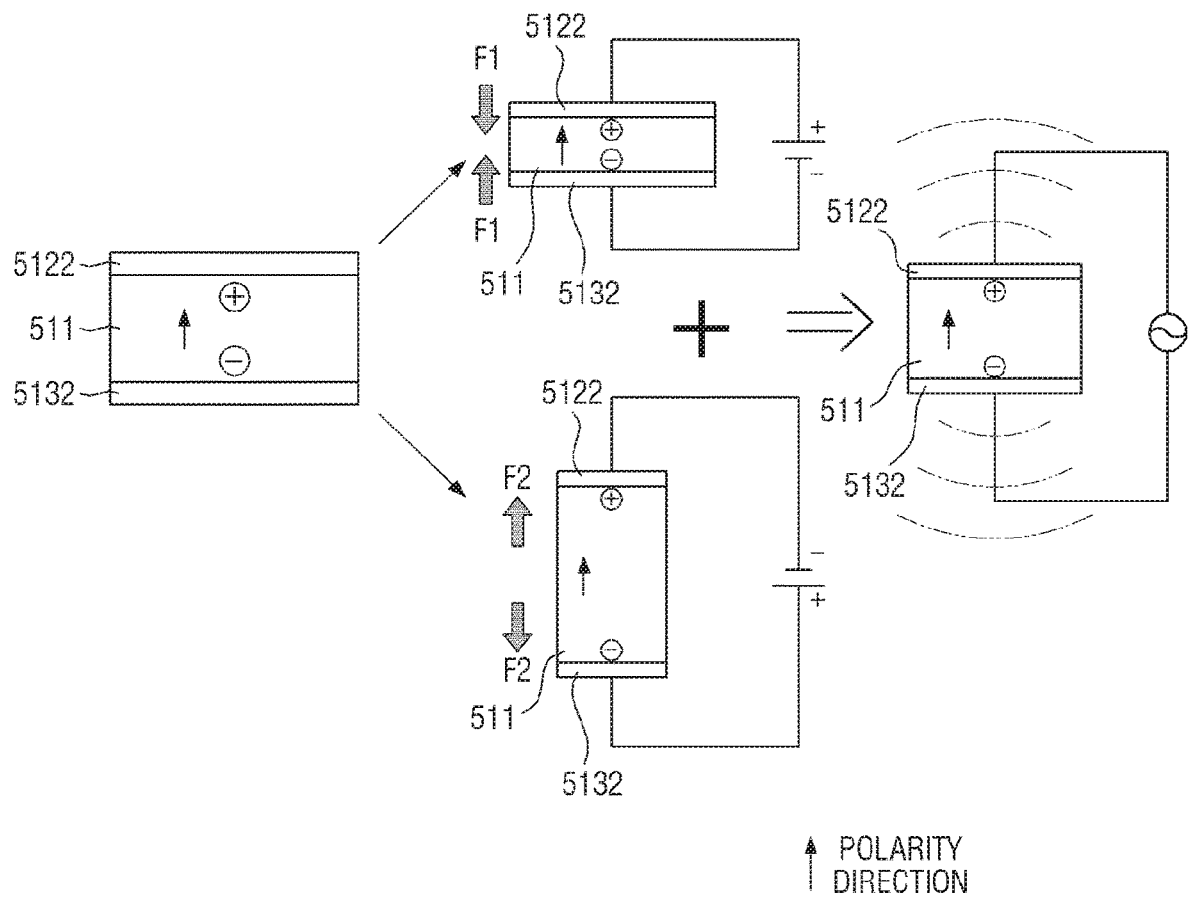
FIG. 10 is a diagram illustrating an exemplary embodiment of a method of vibrating a vibration layer disposed between a first branch electrode and a second branch electrode of the sound generator of FIG. 9.
Figure 11:
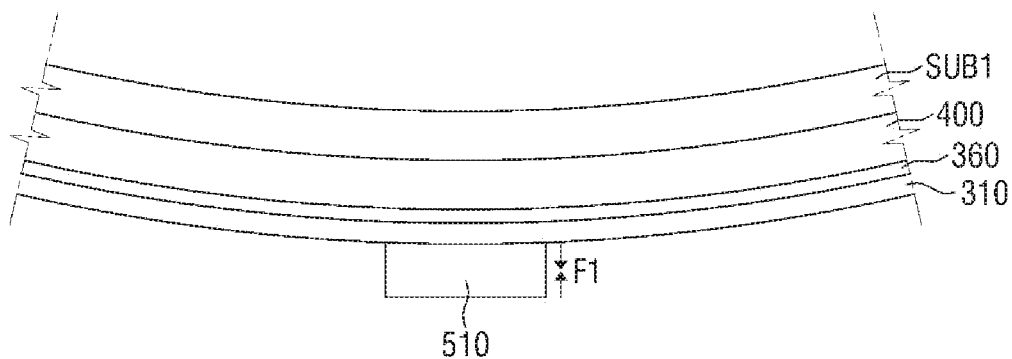
FIGS. 11 and 12 are diagrams illustrating an exemplary embodiment of a method of vibrating the display panel through the vibration of the sound generator of FIG. 10.
Figure 12:
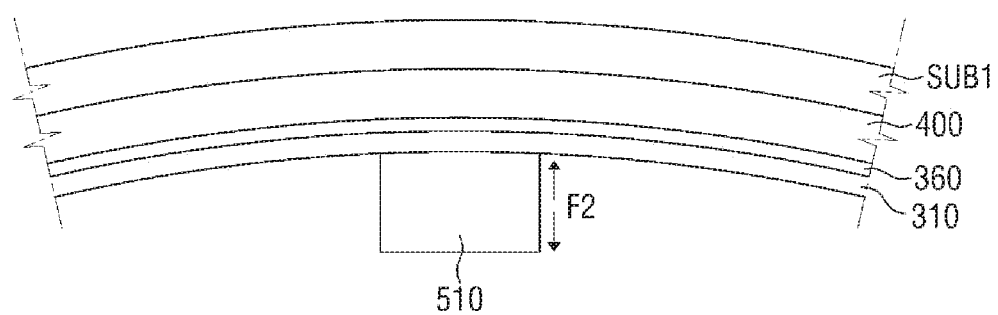

FIG. 9 is a cross-sectional view of an exemplary embodiment of the sound generator 510 of FIG. 7A. FIG. 10 is a diagram illustrating an exemplary embodiment of a method of vibrating a vibration layer 511 disposed between a first branch electrode 5122 and a second branch electrode 5132 of the sound generator 510 of FIG. 9. FIGS. 11 and 12 are diagrams illustrating an exemplary embodiment of a method of vibrating the display panel 300 through the vibration of the sound generator 510 of FIG. 10.

Referring to FIGS. 9 through 12, the sound generator 510 may be a piezoelectric element or a piezoelectric actuator that vibrates the display panel 300 using a piezoelectric material that contracts or expands according to an applied voltage. The sound generator 510 may include the vibration layer 511, a first electrode 512, and a second electrode 513.

The first electrode 512 may include a first stem electrode 5121 and first branch electrodes 5122. The first stem electrode 5121 may be disposed on at least one side surface of the vibration layer 511 as illustrated in FIG. 9. Alternatively, the first stem electrode 5121 may penetrate a part of the vibration layer 511. The first stem electrode 5121 may also be disposed on an upper surface of the vibration layer 511. The first branch electrodes 5122 may branch from the first stem electrode 5121. The first branch electrodes 5122 may be arranged parallel to each other.

The second electrode 513 may include a second stem electrode 5131 and second branch electrodes 5132. The second electrode 513 may be spaced apart from the first electrode 512. Therefore, the second electrode 513 may be electrically insulated from the first electrode 512. The second stem electrode 5131 may be disposed on at least one side surface of the vibration layer 511. In this case, the first stem electrode 5121 may be disposed on a first side surface of the vibration layer 511, and the second stem electrode 5131 may be disposed on a second side surface of the vibration layer 511. Alternatively, the second stem electrode 5131 may penetrate a part of the vibration layer 511. The second stem electrode 5131 may be disposed on the upper surface of the vibration layer 511. The second branch electrodes 5132 may branch from the second stem electrode 5131. The second branch electrodes 5132 may be arranged generally parallel to each other.

The first branch electrodes 5122 and the second branch electrodes 5132 may be arranged generally parallel to each other in a horizontal direction (X-axis or Y-axis direction). In addition, the first branch electrodes 5122 and the second branch electrodes 5132 may be alternately arranged in a vertical direction (Z-axis direction). That is, the first branch electrodes 5122 and the second branch electrodes 5132 may be repeatedly arranged in the vertical direction (Z-axis direction) in the order of the first branch electrode 5122, the second branch electrode 5132, the first branch electrode 5122, and the second branch electrode 5132.

The first electrode pad 514 connected to the first electrode 512 and the second electrode pad 515 connected to the second electrode 513 may be exposed without being covered by the protective layer 519. Therefore, the first electrode pad 514 and the second electrode pad 515 may be connected to the first driving line 522 shown in FIG. 3 and the second driving line 523 shown in FIG. 3 of the FPC 520.

The vibration layer 511 may be a piezoelectric element that is deformed according to a driving voltage applied to the first electrode 512 and a driving voltage applied to the second electrode 513. In this case, the vibration layer 511 may be any one of a piezoelectric material such as a polyvinylidene fluoride (PVDF) film or plumbum ziconate titanate (PZT) and an electroactive polymer.

Since the temperature at which the vibration layer 511 is produced is high, the first electrode 512 and the second electrode 513 may be made of silver (Ag) having a high melting point or an alloy of Ag and palladium (Pd). When the first electrode 512 and the second electrode 513 are made of an alloy of Ag and Pd in order to raise the melting points of the first electrode 512 and the second electrode 513, the Ag content may be higher than the Pd content.

The vibration layer 511 may be disposed between each pair of the first and second branch electrodes 5122 and 5132. The vibration layer 511 may contract or expand according to the difference between the driving voltage applied to each first branch electrode 5122 and the driving voltage applied to a corresponding second branch electrode 5132.

Specifically, referring to FIG. 10, when the polarity direction of the vibration layer 511 disposed between a first branch electrode 5122 and a second branch electrode 5132 disposed under the first branch electrode 5122 is an upward direction (↑), the vibration layer 511 may have a positive polarity in an upper area adjacent to the first branch electrode 5122 and a negative polarity in a lower area adjacent to the second branch electrode 5132. In addition, when the polarity direction of the vibration layer 511 disposed between a second branch electrode 5132 and a first branch electrode 5122 disposed under the second branch electrode 5132 is a downward direction (↓), the vibration layer 511 may have a negative polarity in an upper area adjacent to the second branch electrode 5132 and a positive polarity in a lower area adjacent to the first branch electrode 5122. The polarity direction of the vibration layer 511 may be determined by the poling process of applying an electric field to the vibration layer 511 using a first branch electrode 5122 and a second branch electrode 5132.

When the polarity direction of the vibration layer 511 disposed between a first branch electrode 5122 and a second branch electrode 5132 disposed under the first branch electrode 5122 is the upward direction (↑) as illustrated in FIG. 10, if a driving voltage of the positive polarity is applied to the first branch electrode 5122 and a driving voltage of the negative polarity is applied to the second branch electrode 5132, the vibration layer 511 may contract according to a first force F1. The first force F1 may be a compressive force. Also, if a driving voltage of the negative polarity is applied to the first branch electrode 5122 and a driving voltage of the positive polarity is applied to the second branch electrode 5132, the vibration layer 511 may expand according to a second force F2. The second force F2 may be a tensile force.

Similarly, when the polarity direction of the vibration layer 511 disposed between a second branch electrode 5132 and a first branch electrode 5122 disposed under the second branch electrode 5132 is the downward direction (↓), if a driving voltage of the positive polarity is applied to the second branch electrode 5132 and a driving voltage of the negative polarity is applied to the first branch electrode 5122, the vibration layer 511 may expand according to a tensile force. Also, if a driving voltage of the negative polarity is applied to the second branch electrode 5132 and a driving voltage of the positive polarity is applied to the first branch electrode 5122, the vibration layer 511 may contract according to a compressive force.

When the driving voltage applied to the first electrode 512 and the driving voltage applied to the second electrode 513 repeatedly alternate between the positive polarity and the negative polarity, the vibration layer 511 may repeatedly contract and expand as illustrated in FIGS. 11 and 12, thus causing the sound generator 510 to vibrate. Since the sound generator 510 is disposed on a surface of the display panel 300, when the vibration layer 511 of the sound generator 510 contracts and expands, the display panel 300 may vibrate up and down in a third direction (Z-axis direction), which is the thickness direction of the display panel 300, due to stress as illustrated in FIGS. 11 and 12.

Referring to FIG. 9, the protective layer 519 may be disposed on the second surface and side surfaces of the sound generator 510. That is, the protective layer 519 may be disposed on the first electrode 512 and the second electrode 513 of the sound generator 510 and on the vibration layer 511. The protective layer 519 may surround the first electrode 512, the second electrode 513, and the vibration layer 511. Therefore, the vibration layer 511, the first electrode 512 and the second electrode 513 of the sound generator 510 may be protected by the protective layer 519. The protective layer 519 may be made of an insulating material such as ceramic.

According to the exemplary embodiment illustrated in FIGS. 9 through 12, the sound generator 510 vibrates the display panel 300 according to the first driving voltage and the second driving voltage in a sound mode, thereby outputting sound.

Figure 13:
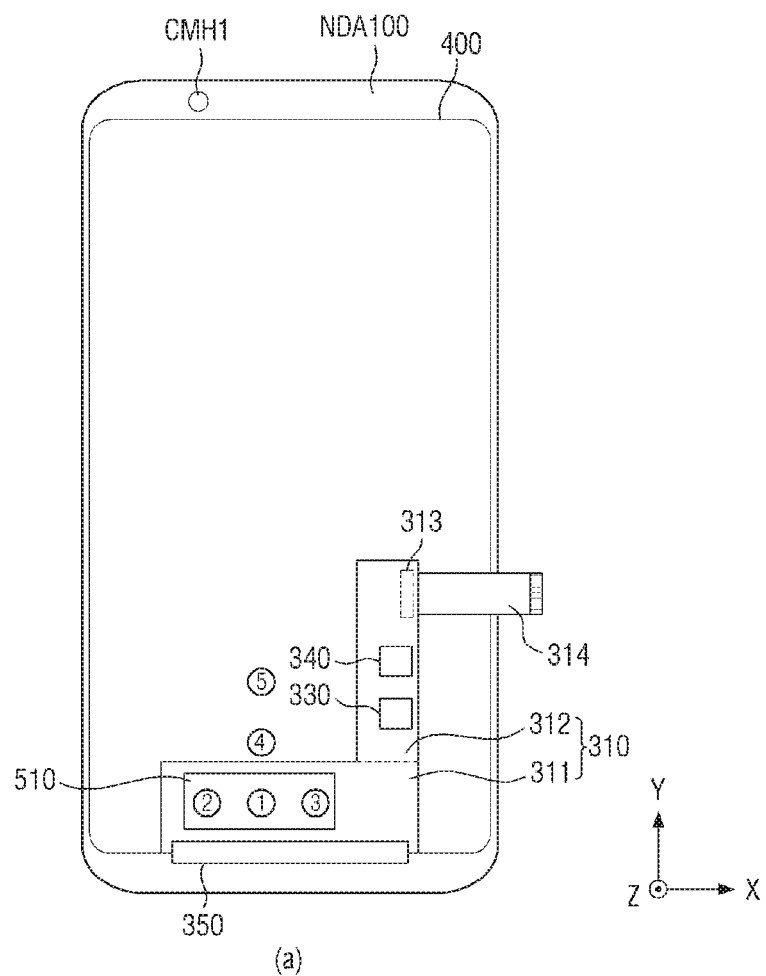
FIG. 13(a) is a bottom view of an exemplary embodiment of a display panel illustrating positions at which the sound generator is attached and FIG. 13(b) is a graph of frequency versus sound pressure level of the sound generator according to the positions at which the sound generator shown in FIG. 13(a) is attached.

FIG. 13(a) is a bottom view of an exemplary embodiment of a display panel illustrating positions at which the sound generator 510 is attached and FIG. 13(b) is a graph of frequency versus sound pressure level of the sound generator according to the positions at which the sound generator 510 shown in FIG. 13(a) is attached.

In FIG. 13(b), the X axis represents the frequency Hz of sound output by vibrating the display panel 300 using the sound generator 510, and the Y axis represents the sound pressure level dB of the sound. FIG. 13(b) illustrates the sound pressure level with respect to the frequency of sound output by vibrating the display panel 300 using the sound generator 510 when a center of the sound generator 510 is attached to a reference position ①, when attached to a position ② on a left side of the reference position ①, when attached to a position ③ on a right side of the reference position ①, when attached to a first position ④ above the reference position ①, and when attached to a second position ⑤ above the reference position ① as shown in FIG. 13(a). The second position ⑤ may be farther from the reference position ① than the first position ④.

Referring to FIG. 13(b), when the center of the sound generator 510 is attached to the position ② or ③ on the left or right side of the reference position ①, the sound pressure level with respect to the frequency of sound is hardly different from the sound pressure level with respect to the frequency of sound when the center of the sound generator 510 is attached to the reference position ①. However, when the center of the sound generator 510 is attached to the first position ④ or the second position ⑤ above the reference position ①, the sound pressure level with respect to the frequency of sound is different from the sound pressure level with respect to the frequency of sound when the center of the sound generator 510 is attached to the reference position ①. In particular, the difference is greatest in a low-frequency band between 100 Hz and 800 Hz. Therefore, a positioning error when attaching the sound generator 510 to a position on the right or left side of the reference position does not matter in view of the sound pressure level with respect to the frequency of sound. However, an error when attaching the sound generator 510 to a position above or below the reference position is not desirable in view of the sound pressure level with respect to the frequency of sound. In this regard, in view of a change in the sound pressure level of sound due to an attachment error of the sound generator 510, the portion of the circuit board 310 to which the sound generator 510 would be attached may be the first circuit board 311 having a length of the display circuit board 310 in the first direction (X-axis direction) which is the horizontal direction may be greater than a length of the display circuit board 310 in the second direction (Y-axis direction) which is the vertical direction as illustrated in FIG. 3.

Figure 14:
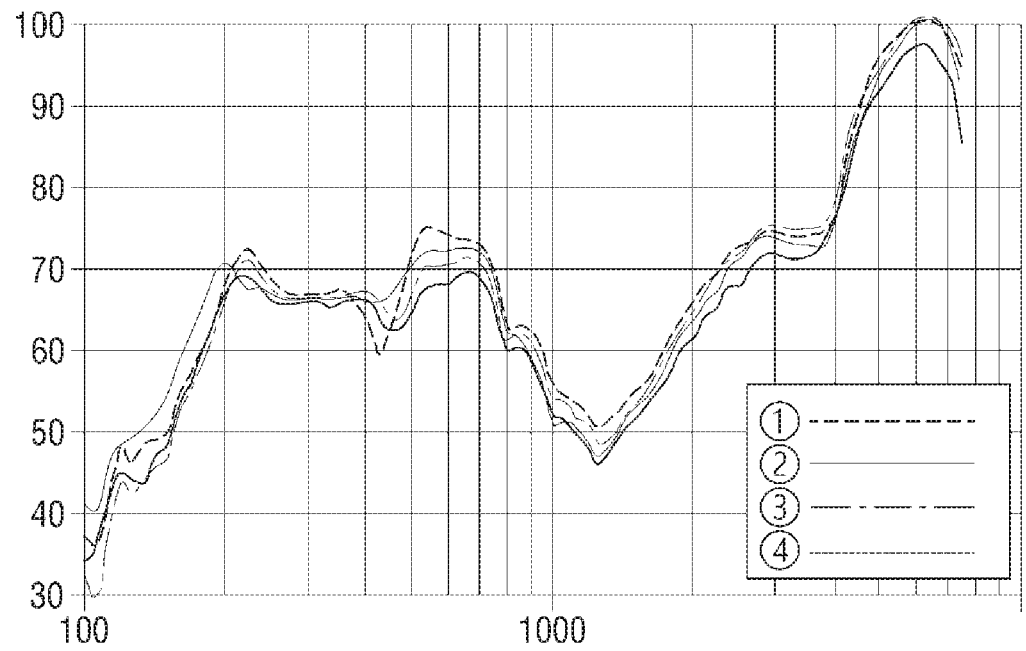
FIG. 14 is a graph of frequency versus sound pressure level of the sound generator according to the thickness of a first circuit board and the thickness of a first adhesive member when the first circuit board to which the sound generator is attached is a flexible printed circuit board.

FIG. 14 is a graph of frequency versus sound pressure level of the sound generator 510 according to the thickness of the first circuit board 311 and the thickness of the first adhesive member 550 when the first circuit board 311 to which the sound generator 510 is attached is a flexible printed circuit board.

In FIG. 14, the X axis represents the frequency Hz of sound output by vibrating the display panel 300 using the sound generator 510, and the Y axis represents the sound pressure level dB of the sound. FIG. 14 illustrates the sound pressure level dB with respect to the frequency of sound when the first circuit board 311 is omitted and the thickness of the first adhesive member 550 is 0.12 mm (①), when the thickness of the first circuit board 311 is 0.10 mm and the thickness of the first adhesive member 550 is 0.24 mm (②), when the thickness of the first circuit board 311 is 0.20 mm and the thickness of the first adhesive member 550 is 0.24 mm (③), and when the thickness of the first circuit board 311 is 0.40 mm and the thickness of the first adhesive member 550 is 0.24 mm (④). As apparent from FIG. 14, as the thickness of each of the first circuit board 311 and the first adhesive member 550 to which the sound generator 510 is attached decreases, the sound pressure level dB with respect to the frequency of sound increases. However, the difference in the sound pressure level dB with respect to the frequency of sound between the four cases ①, ②, ③ and ④ is a maximum of 10 dB or less. That is, the effect of the thickness of each of the first circuit board 311 and the first adhesive member 550 on the sound pressure level with respect to the frequency of sound is not great.

Figure 15:
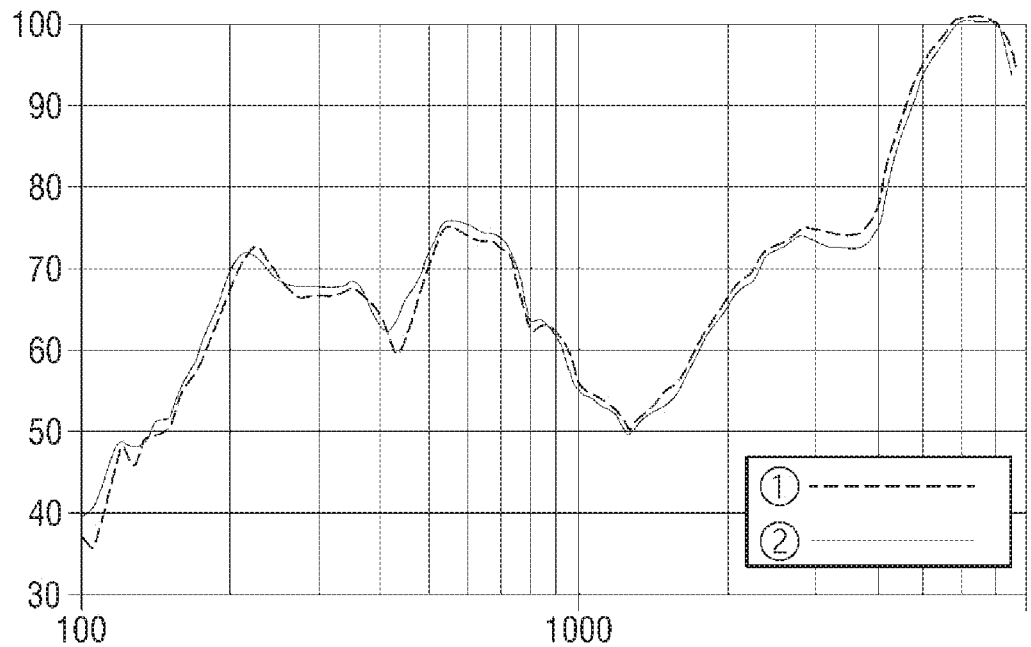
FIG. 15 is a graph of frequency versus sound pressure level of the sound generator according to the thickness of the first circuit board and the thickness of the first adhesive member when the first circuit board to which the sound generator is attached is a rigid printed circuit board.

FIG. 15 is a graph of frequency versus sound pressure level of the sound generator 510 according to the thickness of the first circuit board 311 and the thickness of the first adhesive member 550 when the first circuit board 311 to which the sound generator 510 is attached is a rigid printed circuit board.

In FIG. 15, the X axis represents the frequency Hz of sound output by vibrating the display panel 300 using the sound generator 510, and the Y axis represents the sound pressure level dB of the sound. FIG. 15 illustrates the sound pressure level dB with respect to the frequency of sound when the first circuit board 311 is omitted and the thickness of the first adhesive member 550 is 0.12 mm (①) and when the thickness of the first circuit board 311 is 0.25 mm and the thickness of the first adhesive member 550 is 0.24 mm (②). As apparent from FIG. 15, the difference in the sound pressure level dB with respect to the frequency of sound between the two cases ① and ② is a maximum of 10 dB or less. That is, the effect of the thickness of each of the first circuit board 311 and the first adhesive member 550 on the sound pressure level with respect to the frequency of sound is not great.

Figure 16B:
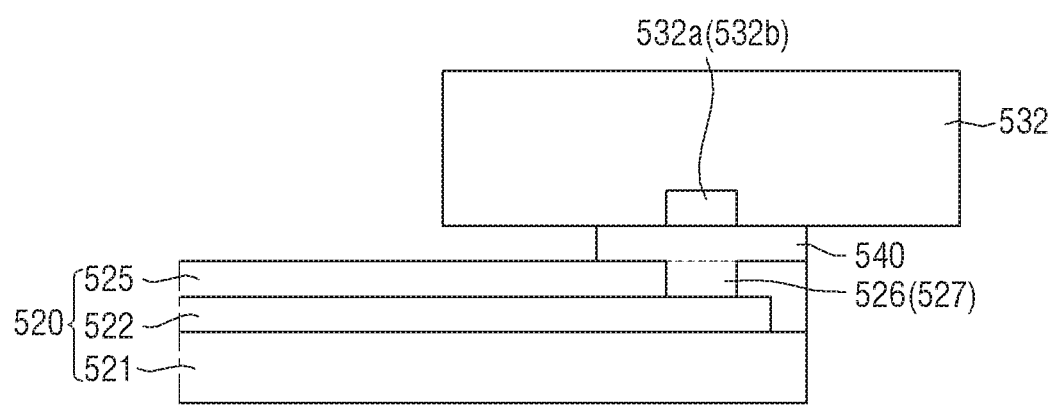
FIG. 16B is a detailed cross-sectional view of an FPC and a sound circuit film of FIG. 16A.

FIG. 16A is a cross-sectional view of another exemplary embodiment of area A of FIG. 3 taken along lines I-I' of FIG. 6. FIG. 16B is a detailed cross-sectional view of an FPC 520 and a sound circuit film 532 of FIG. 16A. In FIGS. 16A and 16B, a case where the sound connection portion 530 is the sound circuit film 532 is illustrated.

The exemplary embodiment illustrated in FIGS. 16A and 16B is different from the exemplary embodiment illustrated in FIG. 7A in that the FPC 520 includes circuit pads instead of the connection terminal 524 and that the sound circuit film 532 instead of the sound connector 531 is disposed on a display circuit board 310. In FIG. 16A, differences from the exemplary embodiment of FIG. 7A will be mainly described.

Referring to FIGS. 16A and 16B, the FPC 520 may include a second base layer 521, a first driving line 522, a second driving line 523, a second solder-resist layer 525, a first circuit pad 526, and a second circuit pad 527.

The second base layer 521, the first driving line 522, the second driving line 523, and the second solder-resist layer 525 of the FPC 520 are substantially the same as those described above with reference to FIGS. 7A and 7C, and thus a description thereof is omitted to avoid redundancy.

The first circuit pad 526 may be formed at an end of the first driving line 522 disposed opposite the other end connected to a first electrode pad 514. The second circuit pad 527 may be formed at an end of the second driving line 523 shown in FIG. 6 disposed opposite the other end connected to a second electrode pad 515.

The sound circuit film 532 may be disposed on a second surface of the display circuit board 310 and may include a first film pad 532a and a second film pad electrically connected to the first circuit pad 526 and the second circuit pad 527 of the FPC 520. An anisotropic conductive adhesive member 540 may be disposed between the first circuit pad 526 and the first film pad 532a and between the second circuit pad 527 and the second film pad.

The first film pad 532a and the second film pad may respectively be connected to second conductive lines 310c among conductive lines 310b and 310c. The sound circuit film 532 may be connected to a sound driver circuit 340 by the second conductive lines 310c. Therefore, a first driving voltage of the sound driver circuit 340 shown in FIG. 3 may be applied to the first electrode pad 514 of a sound generator 510 through any one of the second conductive lines 310c, the sound circuit film 532, and the first driving line 522. In addition, a second driving voltage of the sound driver circuit 340 may be applied to the second electrode pad 515 of the sound generator 510 through another one of the second conductive lines 310c, the sound connector 531, and the second driving line 523.

According to the exemplary embodiment illustrated in FIGS. 16A and 16B, the sound generator 510 may be attached to a surface of the display circuit board 310 by an adhesive member and may be electrically connected to the sound circuit film 532 disposed on the surface of the display circuit board 310 by the FPC 520. The sound generator 510 may be integrally formed with the display circuit board 310 in a manufacturing process of the display circuit board 310. Therefore, a process or equipment for attaching the sound generator 510 to a lower surface of an under-panel cover 400 can be omitted, thereby reducing manufacturing costs.

Hence, there is no need to provide a space to which the sound generator 510 is to be attached in the under-panel cover 400.

Figure 17:
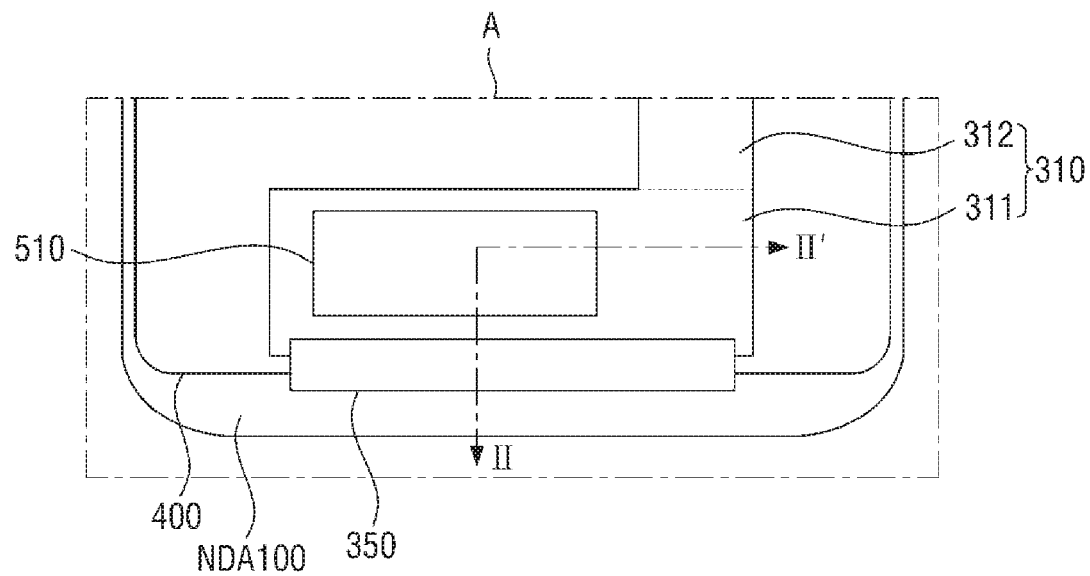
FIG. 17 is an enlarged bottom view illustrating another exemplary embodiment of area A of FIG. 3.

FIG. 17 is an enlarged bottom view illustrating another exemplary embodiment of area A of FIG. 3.

Figure 18A:
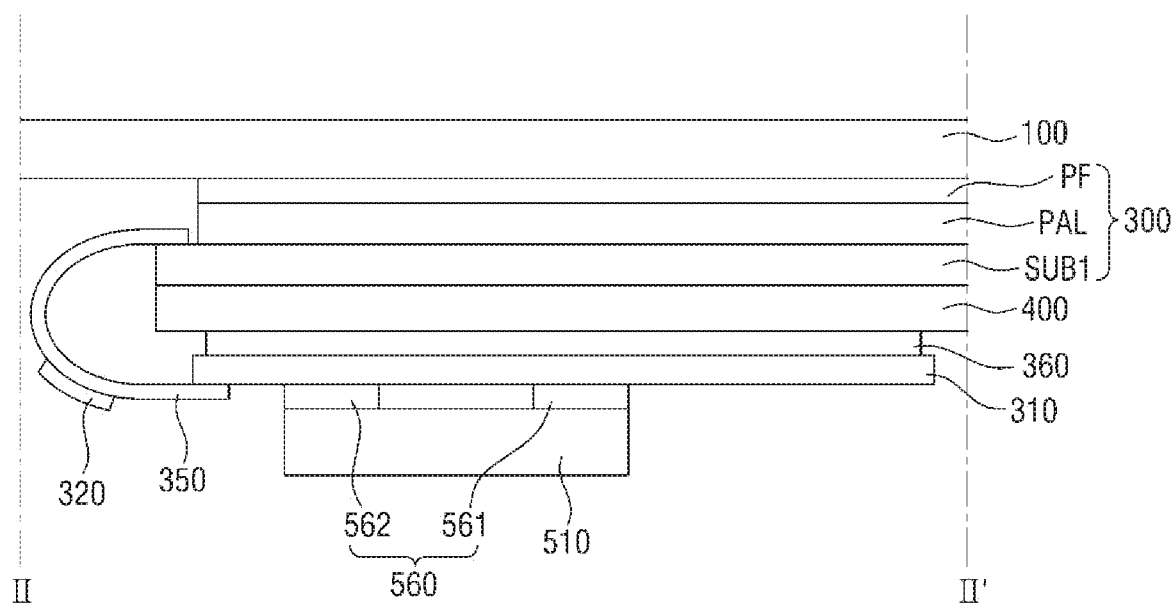
FIG. 18A is a cross-sectional view taken along lines II-II' of FIG. 17.
Figure 18B:
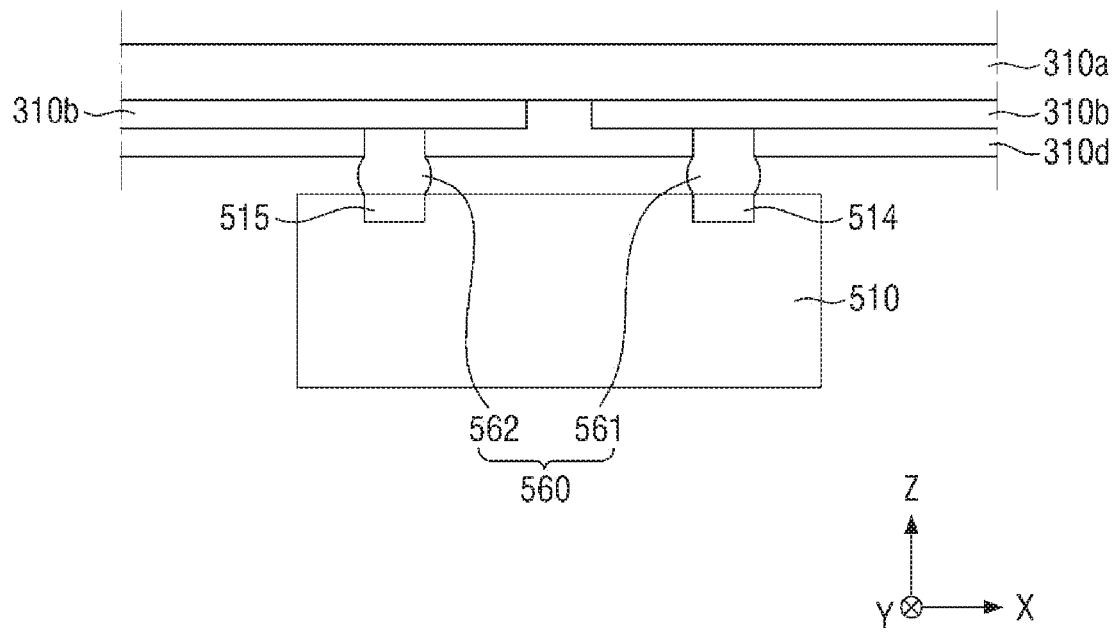
FIG. 18B is a detailed cross-sectional view of the display circuit board and sound generator of FIG. 18A.

The exemplary embodiment illustrated in FIG. 17 is different from the exemplary embodiment illustrated in FIG. 6 in that the FPC 520 and the sound connection portion 530 are omitted. That is, in FIG. 17, a sound generator 510 is electrically connected to conductive lines of a display circuit board 310 without the FPC 520 and the sound connection unit 530, unlike in the exemplary embodiment of FIG. 6. The sound generator 510 may be electrically connected to the conductive lines of the display circuit board 310 by the soldering 560 as illustrated in FIGS. 18A and 18B. Alternatively, the sound generator 510 may be electrically connected to the conductive lines of the display circuit board 310 by an anisotropic conductive adhesive member 570 as illustrated in FIGS. 19A, 19B, 20A and 20B.

FIG. 18A is a cross-sectional view of taken along lines II-IF of FIG. 17. FIG. 18B is a detailed cross-sectional view of the display circuit board 310 and the sound generator 510 of FIG. 18A.

A cover window 100, a substrate SUB1 of a display panel 300, a pixel array layer PAL, a polarizing film PF, a flexible film 350, and an under-panel cover 400 are substantially the same as those described above with reference to FIG. 7A, and thus a description thereof is omitted to avoid redundancy.

Referring to FIGS. 18A and 18B, the display circuit board 310 may be disposed on the under-panel cover 400. A first surface of the display circuit board 310 may be a surface facing the under-panel cover 400, and a second surface of the display circuit board 310 may be a surface opposite the first surface. As illustrated in FIGS. 18A and 18B, the display circuit board 310 may be attached and fixed to the under-panel cover 400 by an adhesive member 360 such as a PSA. However, exemplary embodiments are not limited to this case. For example, the display circuit board 310 may be fixed to the under-panel cover 400 by a fixing member such as screws.

The display circuit board 310 may include a first base layer 310a, conductive lines 310b disposed on a surface of the first base layer 310a, and a first solder-resist layer 310d disposed on the conductive lines 310b as illustrated in FIGS. 18A and 18B. The first base layer 310a may be made of rigid or flexible plastic. The first solder-resist layer 310d refers to an insulating layer for protecting the conductive lines 310b.

The sound generator 510 may be disposed on the second surface of the display circuit board 310. A first surface of the sound generator 510 may be a surface facing the display circuit board 310, and a second surface of the sound generator 510 may be a surface opposite the first surface. A first electrode pad 514 of the sound generator 510 may be exposed on the first surface of the sound generator 510 without being covered by a protective layer 519 disposed on the outside of the sound generator 510, as illustrated in FIGS. 18A and 18B. A second electrode pad 515 of the sound generator 510 may also be exposed on the first surface of the sound generator 510 without being covered by the protective layer 519 disposed on the outside of the sound generator 510, as illustrated in FIGS. 18A and 18B. In addition, each of the conductive lines 310b may be partially exposed without being covered by the first solder-resist layer 310d.

The first electrode pad 514 of the sound generator 510 exposed without being covered by the protective layer 519 and any one of the conductive lines 310b exposed without being covered by the first solder-resist layer 310d may be electrically connected by a first soldering 561. The first soldering 561 refers to an area that connects the first electrode pad 514 and any one of the conductive lines 310b by the soldering.

The second electrode pad 515 of the sound generator 510 exposed without being covered by the protective layer 519 and another one of the conductive lines 310b exposed without being covered by the first solder-resist layer 310d may be electrically connected by a second soldering 562. The second soldering 562 refers to an area that connects the second electrode pad 515 and another one of the conductive lines 310b by the soldering.

In order to stably fix the sound generator 510 to the display circuit board 310 by the soldering, the first soldering 561 may be disposed close to the right side on the first surface of the sound generator 510, and the second soldering 562 may be disposed close to the left side on the first surface of the sound generator 510. When both the first soldering 561 and the second soldering 562 are disposed on one side on the first surface of the sound generator 510, a dummy soldering which electrically connects a dummy electrode pad of the sound generator 510 to any one of the conductive lines 310b exposed without being covered by the first solder-resist layer 310d may be disposed on a side opposite the one side on the first surface of the sound generator 510. The dummy electrode pad may be exposed without being covered by the protective layer 519 and may extend from a first electrode 512 or a second electrode 513 of the sound generator 510.

The conductive lines 310b of the display circuit board 310 may be connected to a sound driver circuit 340. Therefore, a first driving voltage of the sound driver circuit 340 may be applied to the first electrode pad 514 of the sound generator 510 through any one of the conductive lines 310b and the first soldering 561. In addition, a second driving voltage of the sound driver circuit 340 may be applied to the second electrode pad 515 of the sound generator 510 through another one of the conductive lines 310b and the second soldering 562.

According to the exemplary embodiment illustrated in FIGS. 18A and 18B, the first electrode pad 514 of the sound generator 510 may be connected to any one of the conductive lines 310b of the display circuit board 310 by the first soldering 561, and the second electrode pad 515 of the sound generator 510 may be connected to another one of the conductive lines 310b of the display circuit board 310 by the second soldering 562. Therefore, the sound generator 510 may be integrally formed with the display circuit board 310 in a manufacturing process of the display circuit board 310. Accordingly, a process or equipment for attaching the sound generator 510 to a lower surface of the under-panel cover 400 can be omitted, thereby reducing manufacturing costs. In addition, there is no need to provide a space to which the sound generator 510 is to be attached in the under-panel cover 400.

Figure 19A:
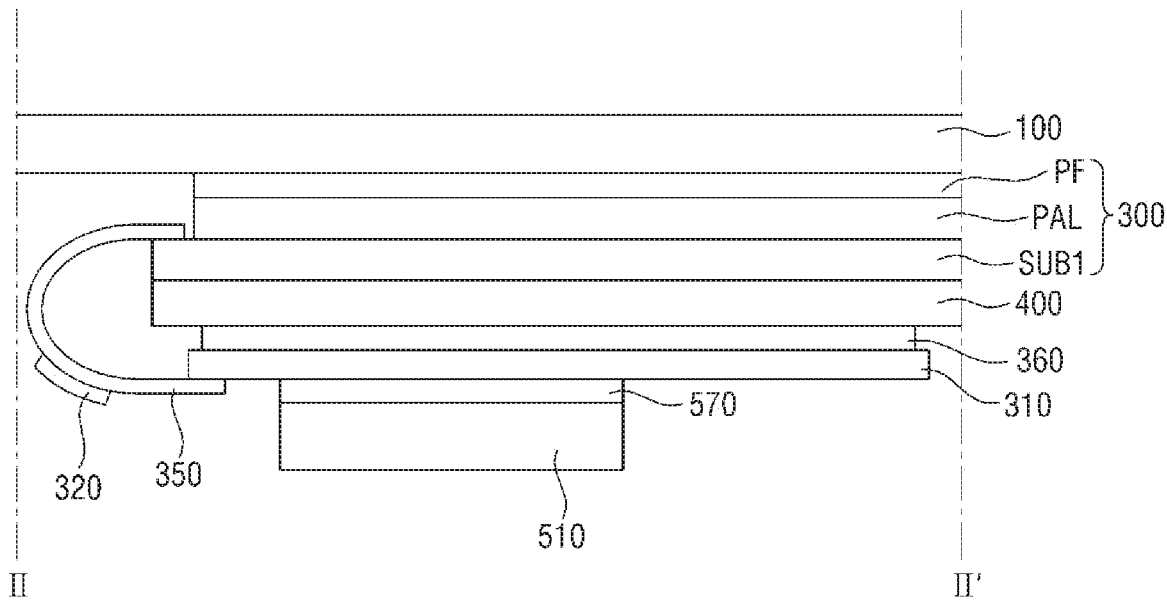
FIG. 19A is a cross-sectional view of another exemplary embodiment of area A of FIG. 3 taken along lines II-II' of FIG. 17.

FIG. 19A is a cross-sectional view of another exemplary embodiment of area A of FIG. 3 taken along lines II-II' of FIG. 17 and FIG. 19B is a detailed cross-sectional view of the display circuit board and the sound generator of FIG. 19A.

The exemplary embodiment illustrated in FIGS. 19A and 19B is different from the exemplary embodiment illustrated in FIGS. 18A and 18B in that a first electrode pad 514 and a second electrode pad 515 of a sound generator 510 are respectively electrically connected to conductive lines 310b of a display circuit board 310 using an anisotropic conductive adhesive member 570 instead of the soldering 560. In FIGS. 19A and 19B, differences from the exemplary embodiment of FIGS. 18A and 18B will be mainly described.

Referring to FIGS. 19A and 19B, the anisotropic conductive adhesive member 570 may be disposed between a second surface of the display circuit board 310 and a first surface of the sound generator 510. The first electrode pad 514 of the sound generator 510 which is exposed without being covered by a protective layer 519 and any one of the conductive lines 310b which is exposed without being covered by a first solder-resist layer 310d may be electrically connected by the anisotropic conductive adhesive member 570. Even not shown in FIGS. 19A and 19B, the second electrode pad of the sound generator 510 which is exposed without being covered by the protective layer 519 and another one of the conductive lines 310b which is exposed without being covered by the first solder-resist layer 310d also may be electrically connected by the anisotropic conductive adhesive member 570. The anisotropic conductive adhesive member 570 may be an adhesive or adhesive film having conductive balls. For example, the anisotropic conductive adhesive member 570 may be anisotropic conductive paste or an anisotropic conductive film.

In order to stably fix the sound generator 510 to the display circuit board 310 using the anisotropic conductive adhesive member 570, the anisotropic conductive adhesive member 570 may be disposed between the protective layer 519 of the sound generator 510 and the first solder-resist layer 310d of the display circuit board 310. That is, an adhesion area between the sound generator 510 and the display circuit board 310 can be increased.

The conductive lines 310b of the display circuit board 310 may be connected to a sound driver circuit 340. Therefore, a first driving voltage of the sound driver circuit 340 may be applied to the first electrode pad 514 of the sound generator 510 through any one of the conductive lines 310b and the anisotropic conductive adhesive member 570. In addition, a second driving voltage of the sound driver circuit 340 may be applied to the second electrode pad 515 of the sound generator 510 through another one of the conductive lines 310b and the anisotropic conductive adhesive member 570.

According to the exemplary embodiment illustrated in FIGS. 19A and 19B, the first electrode pad 514 of the sound generator 510 may be connected to any one of the conductive lines 310b by the anisotropic conductive adhesive member 570, and the second electrode pad 515 of the sound generator 510 may be connected to another one of the conductive lines 310b of the display circuit board by the anisotropic conductive adhesive member 570. Therefore, the sound generator 510 may be integrally formed with the display circuit board 310 in a manufacturing process of the display circuit board 310. Accordingly, a process or equipment for attaching the sound generator 510 to a lower surface of an under-panel cover 400 can be omitted, thereby reducing manufacturing costs. In addition, there is no need to provide a space to which the sound generator 510 is to be attached in the under-panel cover 400.

Figure 20B:
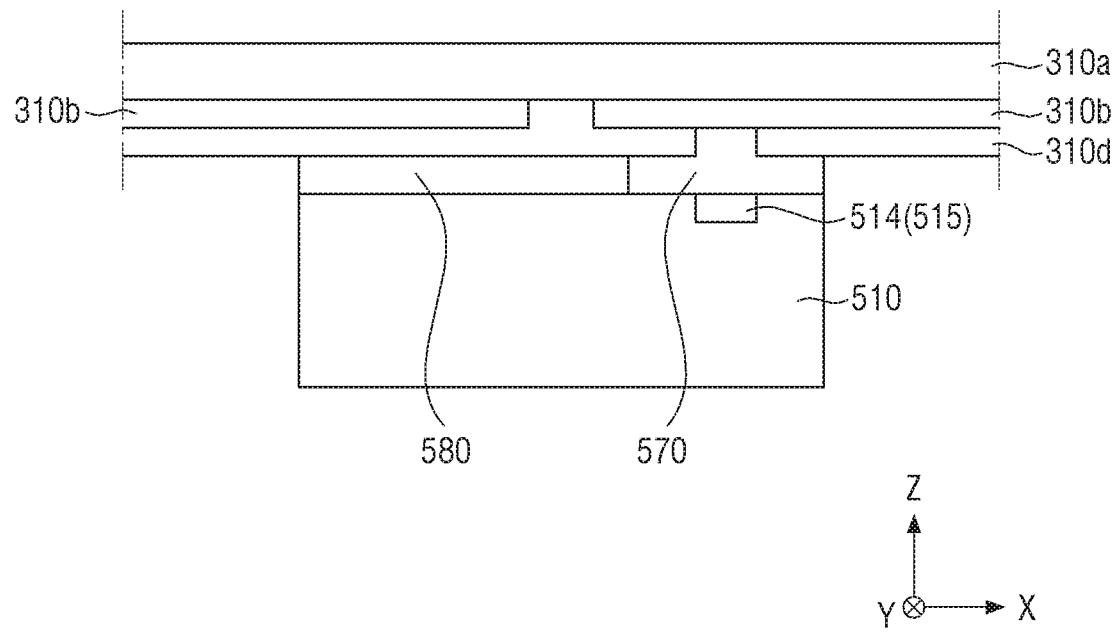
FIG. 20B is a detailed cross-sectional view of the display circuit board and sound generator of FIG. 20A.

FIG. 20A is a cross-sectional view of still another exemplary embodiment of area A of FIG. 3 taken along lines II-II' of FIG. 17 and FIG. 20B is a detailed cross-sectional view of the display circuit board and the sound generator of FIG. 20A.

The exemplary embodiment illustrated in FIGS. 20A and 20B is different from the exemplary embodiment illustrated in FIGS. 19A and 19B in that a second adhesive member 580 instead of the anisotropic conductive adhesive member 570 is attached between a protective layer 519 of a sound generator 510 and a first solder-resist layer 310d of a display circuit board 310. That is, in FIGS. 20A and 20B, the second adhesive member 580 may be disposed between at least a part of a first surface of the sound generator 510 and a second surface of the display circuit board 310. In addition, the second adhesive member 580 may not overlap a first electrode pad 514 and a second electrode pad 515 in the thickness direction (Z-axis direction) of the display circuit board 310.

Figure 21:
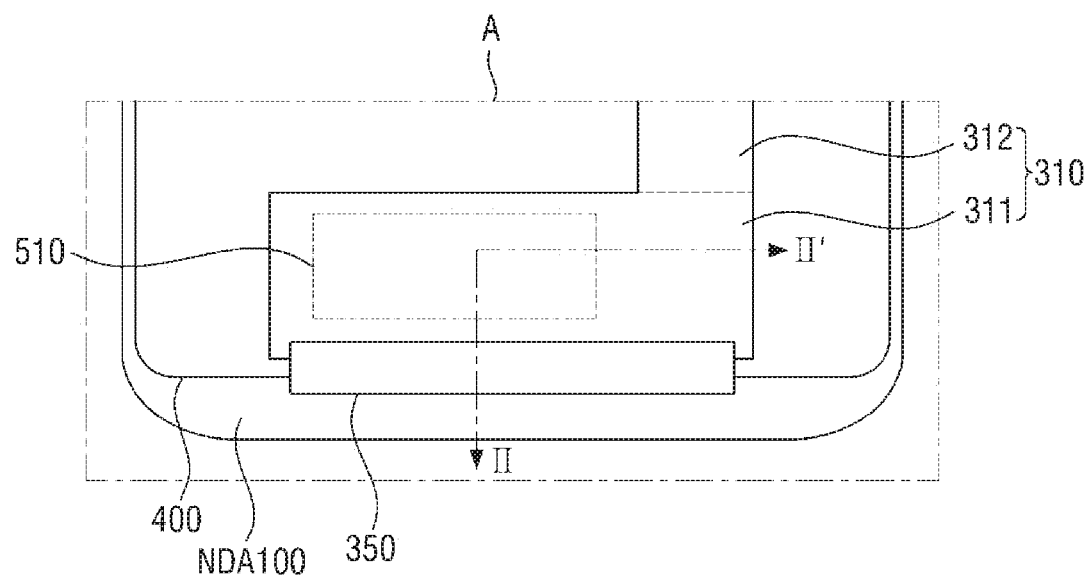
FIG. 21 is an enlarged bottom view illustrating still another exemplary embodiment of area A of FIG. 3.
Figure 22:
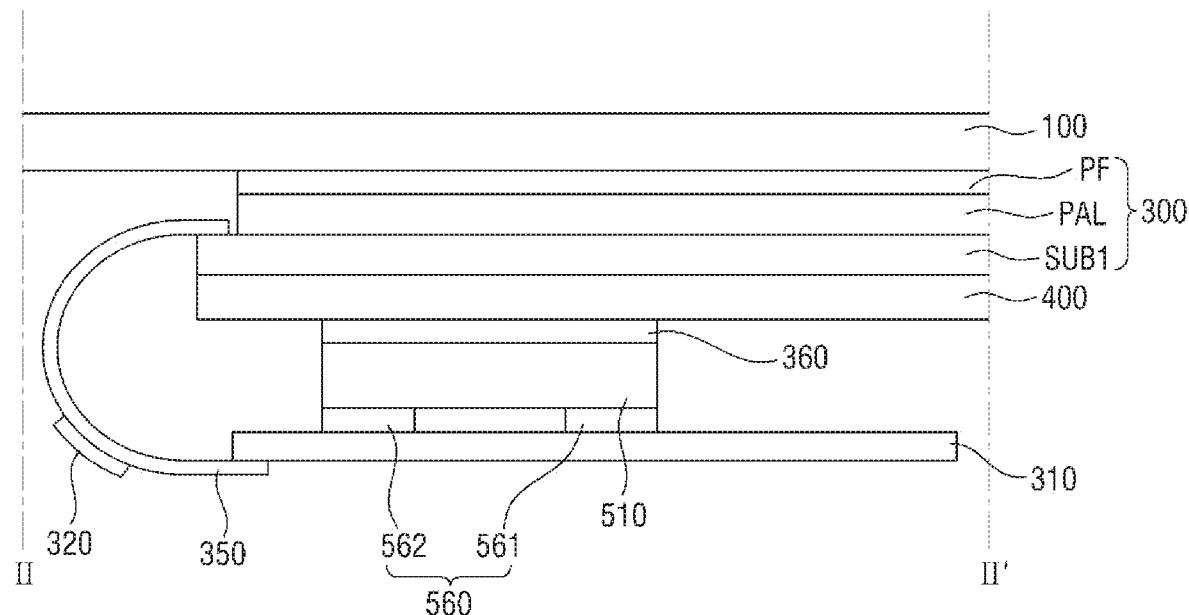
FIG. 22 is a cross-sectional view taken along lines of FIG. 21 illustrating other embodiment of area A of FIG. 3.
Figure 23:
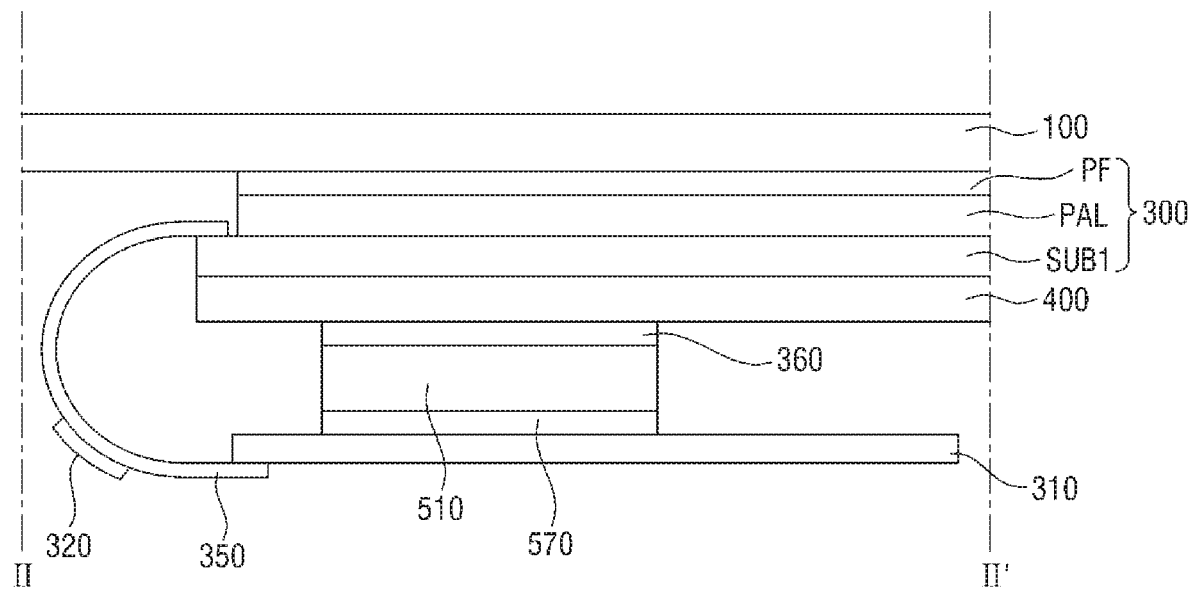
FIG. 23 is a cross-sectional view taken along lines III-III' of FIG. 21 illustrating still other embodiment of area A of FIG. 3.
Figure 24:
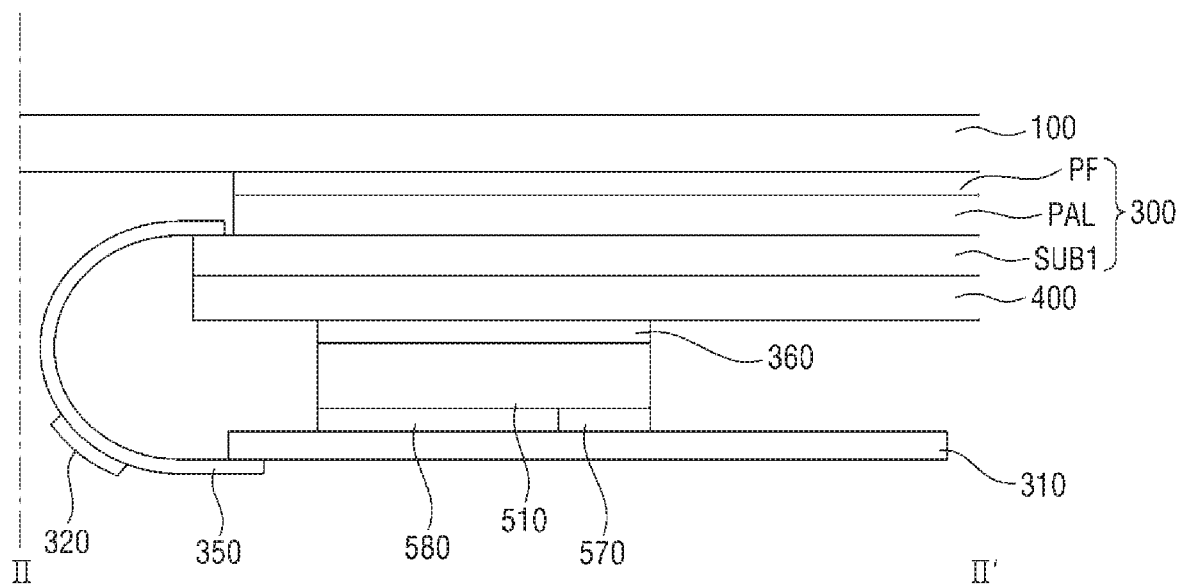
FIG. 24 is a cross-sectional view taken along lines III-III' of FIG. 21 illustrating still other embodiment of area A of FIG. 3.

FIG. 21 is an enlarged bottom view illustrating still another exemplary embodiment of area A of FIG. 3. FIGS. 22, 23 and 24 are cross-sectional views taken along lines III-III' of FIG. 21 illustrating other embodiments of area A of FIG. 3.

The exemplary embodiment illustrated in FIG. 21 is different from the exemplary embodiment illustrated in FIG. 6 in that the FPC 520 and the sound connection portion 530 are omitted and the sound generator 510 is disposed between an under-panel cover 400 and a display circuit board 310. That is, in FIG. 21, the sound generator 510 is electrically connected to conductive lines of the display circuit board 310 without the FPC 520 and the sound connection unit 530, unlike in the exemplary embodiment of FIG. 6.

The sound generator 510 may be electrically connected to the conductive lines of the display circuit board 310 by the soldering 560 as illustrated in FIG. 22. The exemplary embodiment illustrated in FIG. 22 is substantially the same as the exemplary embodiment described above with reference to FIGS. 18A and 18B except that the sound generator 510 is disposed between the under-panel cover 400 and the display circuit board 310, and thus a description thereof is omitted to avoid redundancy.

Alternatively, the sound generator 510 may be electrically connected to the conductive lines of the display circuit board 310 by an anisotropic conductive adhesive member 570 as illustrated in FIGS. 23 and 24. The exemplary embodiments illustrated in FIGS. 23 and 24 are substantially the same as the exemplary embodiments described above with reference to FIGS. 19A, 19B, 20A and 20B except that the sound generator 510 is disposed between the under-panel cover 400 and the display circuit board 310, and thus a description thereof is omitted to avoid redundancy.

In a display device having a circuit board and sound generator constructed according to one or more exemplary embodiments, the sound generator that vibrates a display panel to output sound is disposed on a surface of the display circuit board. Therefore, it is possible to output sound using the display panel as a vibration surface by using the sound generator not exposed to the outside. Thus, a call receiver (e.g., speaker module) for outputting the other party's voice can be removed from the front of the display device, thereby enlarging a transmissive portion of a cover window. Accordingly, the display area can be enlarged.

In a display device having a circuit board and sound generator constructed according to one or more exemplary embodiments, the sound generator may be attached to a surface of the display circuit board by an adhesive member and may be electrically connected to a sound connection portion disposed on the surface of the display circuit board by an FPC. Therefore, the sound generator may be integrally formed with the display circuit board in a manufacturing process of the display circuit board. Accordingly, a process or equipment for attaching the sound generator to a lower surface of an under-panel cover can be omitted, thereby reducing manufacturing costs. In addition, there is no need to provide a space to which the sound generator is to be attached in the under-panel cover.

In a display device having a circuit board and sound generator constructed according to one or more exemplary embodiments, electrode pads of the sound generator and conductive lines of the display circuit board are respectively electrically connected by a soldering or an anisotropic conductive adhesive member. Therefore, the sound generator may be integrally formed with the display circuit board in a manufacturing process of the display circuit board. Accordingly, a process or equipment for attaching the sound generator to a lower surface of an under-panel cover can be omitted, thereby reducing manufacturing costs. In addition, there is no need to provide a space to which the sound generator is to be attached in the under-panel cover.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A circuit board for a display device comprising:
a base layer;
conductive lines disposed on the base layer;
an insulating layer disposed on the conductive lines;
a sound generator disposed on the insulating layer, the sound generator configured to contract and expand according to the polarity of driving voltages applied thereto, and comprising: a first electrode to which a first driving voltage is applied; a second electrode to which a second driving voltage is applied; a vibration layer disposed between the first electrode and the second electrode to contract or expand according to the first driving voltage and the second driving voltage; and a protective layer at least partially surrounding the first electrode, the second electrode, and the vibration layer.

2. The circuit board of claim 1, wherein the sound generator further comprises:
a first electrode pad exposed by the protective layer and connected to the first electrode; and
a second electrode pad exposed by the protective layer and connected to the second electrode.

3. The circuit board of claim 2, further comprising:
a first adhesive member disposed between the insulating layer and a surface of the sound generator;
a flexible printed circuit (FPC) having a first driving line electrically connected to the first electrode pad, a second driving line electrically connected to the second electrode pad, and a connection terminal connected to the first driving line and the second driving line; and
a connector disposed on the base layer and comprising an insertion portion into which the connection terminal is inserted.

4. The circuit board of claim 2, further comprising:
a first adhesive member disposed between the insulating layer and a surface of the sound generator;
a flexible printed circuit (FPC) having a first driving line electrically connected to the first electrode pad, a second driving line electrically connected to the second electrode pad, a first circuit pad connected to the first driving line, and a second circuit pad connected to the second driving line;
a circuit film disposed on the base layer and having a first film pad electrically connected to any one of the conductive lines and a second film pad electrically connected to another one of the conductive lines; and
an anisotropic conductive adhesive member disposed between the first circuit pad and the first film pad and between the second circuit pad and the second film pad.

5. The circuit board of claim 2, further comprising:
a first soldering electrically connecting any one of the conductive lines and the first electrode pad; and
a second soldering electrically connecting another one of the conductive lines and the second electrode pad.

6. The circuit board of claim 2, further comprising an anisotropic conductive adhesive member disposed between any one of the conductive lines and the first electrode pad and between another one of the conductive lines and the second electrode pad.

7. The circuit board of claim 6, further comprising:
a solder-resist layer disposed on the conductive lines; and
a second adhesive member disposed between the protective layer of the sound generator and the solder-resist layer.

8. The circuit board of claim 7, wherein the second adhesive member does not overlap the first electrode pad and the second electrode pad in a thickness direction of the sound generator.

9. A display device comprising:
a display panel;
a circuit board disposed on a first surface of the display panel and having a first circuit board and a second circuit board, the first circuit board having a first width in a first direction, the second circuit board having a second width in the first direction, with the first width being larger than the second width; and
a sound generator overlapping the first circuit board in a thickness direction of the display panel to output sound by vibrating the display panel, and comprising:
a first electrode to which a first driving voltage is applied;
a second electrode to which a second driving voltage is applied;
a vibration layer disposed between the first electrode and the second electrode to contract or expand according to the first driving voltage and the second driving voltage; and
a protective layer at least partially surrounding the first electrode, the second electrode, and the vibration layer.

10. The display device of claim 9, wherein the sound generator is disposed on a second surface opposite a first surface of the circuit board which faces the first surface of the display panel.

11. The display device of claim 10, further comprising a first adhesive member disposed between the second surface of the circuit board and a first surface of the sound generator.

12. The display device of claim 11, further comprising:
a flexible circuit board (FPC) having driving lines electrically connected to electrode pads disposed on a second surface opposite the first surface of the sound generator and a connection terminal connected to the driving lines; and
a connector disposed on the second surface of the circuit board and comprising an insertion portion into which the connection terminal is inserted.

13. The display device of claim 11, further comprising:
a flexible circuit board (FPC) having driving lines connected to electrode pads disposed on a second surface opposite the first surface of the sound generator and circuit pads connected to the driving lines;

a circuit film disposed on the second surface of the circuit board and having film pads electrically connected to the circuit pads; and an anisotropic conductive adhesive member disposed between the circuit pads and the film pads.

14. The display device of claim 10, further comprising a soldering electrically connecting electrode pads disposed on the first surface of the sound generator and conductive lines disposed on the second surface of the circuit board.

15. The display device of claim 10, further comprising an anisotropic conductive adhesive member disposed between electrode pads disposed on the first surface of the sound generator and conductive lines disposed on the second surface of the circuit board.

16. The display device of claim 15, further comprising a second adhesive member disposed between at least a part of the first surface of the sound generator and the second surface of the circuit board.

17. The display device of claim 16, wherein the second adhesive member does not overlap the electrode pads in a thickness direction of the circuit board.

18. The display device of claim 10, further comprising a flexible film disposed between the display panel and the circuit board and on which an integrated driver circuit for driving the display panel is disposed.

19. The display device of claim 18, further comprising:
a power supply circuit to supply display driving voltages to the integrated driver circuit; and
a sound driver circuit to supply sound driving voltages to the sound generator.

20. The display device of claim 19, wherein the power supply circuit and the sound driver circuit are disposed on the circuit board.

21. The display device of claim 10, wherein the sound generator is disposed between the first surface of the display panel and the first surface of the circuit board which faces the first surface of the display panel.

22. The display device of claim 21, further comprising a soldering electrically connecting electrode pads disposed on the first surface of the sound generator and conductive lines disposed on the first surface of the circuit board.

23. The display device of claim 22, further comprising an anisotropic conductive adhesive member disposed between electrode pads disposed on the first surface of the sound generator and conductive lines disposed on the first surface of the circuit board.

* * * * *